(12) United States Patent
Kagaya

(10) Patent No.: US 9,751,146 B2
(45) Date of Patent: Sep. 5, 2017

(54) NOZZLE FOR HEATING DEVICE, HEATING DEVICE, AND NOZZLE FOR COOLING DEVICE

(75) Inventor: Tomotake Kagaya, Chiba (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 642 days.

(21) Appl. No.: 13/497,245

(22) PCT Filed: Aug. 3, 2010

(86) PCT No.: PCT/JP2010/063101
§ 371 (c)(1),
(2), (4) Date: Mar. 20, 2012

(87) PCT Pub. No.: WO2011/036948
PCT Pub. Date: Mar. 31, 2011

(65) Prior Publication Data
US 2012/0178039 A1    Jul. 12, 2012

(30) Foreign Application Priority Data
Sep. 24, 2009 (JP) ................................ 2009-219542

(51) Int. Cl.
*F24H 9/00* (2006.01)
*B23K 1/008* (2006.01)
(Continued)

(52) U.S. Cl.
CPC ............ *B23K 1/008* (2013.01); *B23K 1/0016* (2013.01); *B23K 3/08* (2013.01); *B23K 2201/42* (2013.01); *H05K 3/3494* (2013.01)

(58) Field of Classification Search
USPC .......................................... 432/219; 165/177
See application file for complete search history.

(56) References Cited

U.S. PATENT DOCUMENTS 2,525,157 A    10/1950  Trane
3,901,445 A *   8/1975  Chang ................. C21C 5/4606
                                                          239/132.3
(Continued)

FOREIGN PATENT DOCUMENTS

CN    2559183 Y    7/2003
CN    1893774 A    1/2007
(Continued)

OTHER PUBLICATIONS

State Intellectual Property Office of P.R. China, Notification of Rejection Reason(s) w. attached English Translation, dated Dec. 5, 2013 in application No. 201080042596..1.
(Continued)

*Primary Examiner* — Alissa Tompkins
*Assistant Examiner* — John Bargero
(74) *Attorney, Agent, or Firm* — Chernoff Vilhauer McClung & Stenzel, LLP

(57) ABSTRACT

To achieve an improvement of heat exchanger effectiveness (heat transfer rate) without any increase of a fan motor output.
The gas heated by the heating units or the gas cooled down by the cooling units is sent to the blowing nozzles 2 by a fan. Then, the blowing nozzles 2 blow the gas sent by the fan through their outlets. Each of the outlets has a non-circular planar shape with a projection portion thereof being projected inwardly. This allows a shape of the gas in cross section perpendicular to a direction where the gas is blown through the outlet of each of the blowing nozzles 2 to be changed by the projection portion with time (switching phenomenon). Such a switching phenomenon enables to be increased the heat exchanger effectiveness (heat transfer rate) on the printed board even if any output of the fan motor for rotating the fan does not increase.

6 Claims, 12 Drawing Sheets

(51) Int. Cl.
*B23K 1/00* (2006.01)
*B23K 3/08* (2006.01)
*B23K 101/42* (2006.01)
*H05K 3/34* (2006.01)

(56) References Cited

U.S. PATENT DOCUMENTS

| | | | | |
|---|---|---|---|---|
| 5,405,074 | A * | 4/1995 | Den Dopper | B23K 1/008 219/388 |
| 7,988,031 | B2 * | 8/2011 | Nakamura | B23K 1/0016 219/420 |
| 2004/0146821 | A1* | 7/2004 | Joshi | F23D 14/583 431/8 |
| 2007/0045382 | A1 | 3/2007 | Shibamura et al. | |
| 2008/0211119 | A1* | 9/2008 | Nieminen et al. | 261/76 |
| 2009/0134142 | A1* | 5/2009 | Nakamura | B23K 1/008 219/420 |

FOREIGN PATENT DOCUMENTS

| | | | |
|---|---|---|---|
| EP | 1849548 | | 10/2007 |
| GB | 25830 | * | 0/1913 |
| GB | 1305047 | | 1/1973 |
| JP | 02303674 A | | 12/1990 |
| JP | 2000294918 A | | 10/2000 |
| JP | 2001144427 A | | 5/2001 |
| JP | 2002-331357 A | | 11/2002 |
| JP | 2003-11247 A | | 1/2003 |
| JP | 2004-214535 A | | 7/2004 |
| JP | WO 2005065876 A1 * | 7/2005 | ........... B23K 1/0016 |
| JP | 200712927 A | | 1/2007 |
| JP | 2009-18648 A | | 1/2009 |

OTHER PUBLICATIONS

Kenyu Oyakawa et al., Impingement Heat Transfer by Jet Issuing from Cross-Shaped Nozzle, Transactions of the Japan Society of Mechanical Engineers. B, 63(607): 233-239, Mar. 25, 1997.

Japanese Patent Office, International Search report for PCT/JP2010/063101, Aug. 31, 2010.

European Patent Office, extended European search report, dated May 30, 2017, Munich, Germany, 6 pgs.

* cited by examiner

NOZZLE FOR HEATING DEVICE, HEATING DEVICE, AND NOZZLE FOR COOLING DEVICE

This is a national stage application filed under 35 USC 371 based on International Application No. PCT/JP2010/063101 filed Aug. 3, 2010, and claims priority under 35 USC 119 of Japanese Patent Application No. 2009-219542 filed Sep. 24, 2009.

TECHNICAL FIELD

The present invention relates to a nozzle of a heating device for heating an object to be heated by blowing hot blast, a heating device, and a nozzle of a cooling device for cooling down an object to be cooled by blowing cold blast.

BACKGROUND ART

In order to solder electronic parts on a printed board by melting a soldering material, a heating oven, such as a reflow soldering apparatus, is used. The reflow soldering apparatus is an apparatus in which a preheating zone, a heating zone, and a cooling zone are provided in a tunnel-like muffle, heaters are respectively provided in the preheating zone and the heating zone, and a cooling device composed of a water-cooling pipe or a cooling fan is provided in the cooling zone. For example, a printed board, to a soldering portion of which a soldering paste is applied by printing or the like, is transported to the respective zones and by melting the soldering paste of the printed board, electronic parts are soldered to the printed board.

In the heater used for the reflow soldering apparatuses, there are an infrared heater and a hot blast heater. The infrared heater emits infrared ray when the infrared heater is electrically conducted. The soldering paste applied to the soldering portion is melted by the emitted infrared ray to perform the soldering. It, however, has a problem such that it is difficult for the infrared heater to fully heat the soldering portion in the shadow of the electronic parts because the infrared ray travels in a straight line.

On the other hand, the hot blast heater has an advantage in that since a hot blast heated by the heater is circulated by convection by means of a fan rotated by driving of a motor in the heating zone of the reflow soldering apparatus, the hot blast penetrates in any parts in the shadow of the electronic parts and narrow clearances, thereby allowing the whole printed board to be uniformly heated. Today, the hot blast heater is often used in many reflow soldering apparatuses.

As the hot blast heaters installed in the reflow soldering apparatus, there are a heater which blows hot blast through a nozzle having a large opening area, and a heater which blows hot blast through a large number of apertures. The former heater has the nozzle with a large opening area so that a flow rate of hot blast relatively slows down, resulting in a rather poor heating efficiency when the hot blast collides with the printed board. In contrast, the latter heater has the apertures so that the flow rate is more increased than that of the former heater, and the heater provided with many apertures can avoid any shortage of hot blast. Thus, the latter heater achieves a high heating efficiency. Therefore, the reflow soldering apparatuses often use the heater configured to blow hot blast through a large number of apertures. A description hereinafter given relates to the hot blast heater having a plurality of apertures unless stated otherwise.

In the reflow soldering apparatus, heating is performed on the printed board in the order of the preheating and heating. In the preheating, the printed board is slowly heated by hot blast at low temperatures so that the printed board slowly adjusts to heat and a solvent contained in the soldering paste is volatilized. Preheating in the reflow soldering apparatus is preferably performed at lower temperatures by a smaller quantity of hot blast than that of the heating zone.

The printed board is heated in the heating zone of the reflow soldering apparatus after the printed board has slowly been adjusted to heat during the preheating and the solvent contained in the soldering paste has been volatilized so that the electronic parts have been relatively firmly bonded. In the heating, the soldering is performed by blowing hot blast at high temperatures so that a powdery solder material in the soldering paste is melted. A quantity of hot blast blasted to the printed board in the heating enables a temperature rise to accelerate if it is larger than a quantity of hot blast in the preheating. Heating is performed over a short period of time in the heating because a lengthy heat treatment under a high temperature possibly causes a thermal damage to the printed board and the electronic parts.

As a rule, the reflow soldering apparatus is equipped with a large number of hot blast heaters at respective positions above and below printed board transport units in the preheating zone for performing the preheating and the heating zone for performing the heating. For example, in a case where the preheating zone is composed of five zones, a total of ten hot blast heaters are equipped such that five heaters are respectively provided both above and below. In a case where the heating zone is composed of three zones, a total of six hot blast heaters are equipped such that three heaters are respectively provided both above and below. As a result, a total of 16 hot blast heaters are equipped in a reflow soldering apparatus with eight heaters being respectively provided above and below.

It is to be noted that such a zone configuration is suitably selected depending on types of electronic parts to be soldered to the printed board, in other words, the number of the heaters to be used or the like is suitably selected depending on a temperature profile of an object to be heated.

In the preheating zone and the heating zone, control of the flow rates and temperatures of the hot blast blown from the respective hot blast heaters by control means enables a desirable temperature profile suitable for the printed board to be set. Control of the hot blast temperatures by a temperature adjuster and variation of an output of a fan motor (hereinafter, referred to as "fan motor output"), which is attached to a fan, for rotating the fan cause to be controlled the flow rates of the hot blast blown into the muffle. In this connection, as such a motor, an inverter motor is generally used which is easy to control an output of the fan motor.

For example, the Patent Document 1 discloses an example of such a reflow soldering apparatus equipped with the heaters configured to blow hot blast through a large number of apertures. This heating oven is provided with a plurality of blast ports which blows hot blast and a plurality of recovery ports for forcibly recovering the hot blast blown through the plurality of blast ports and redirected after hitting an object to be heated. According to the heating oven, the hot blast cooled down by hitting the object to be heated and being redirected thereby is efficiently removed without the hot blast staying on a surface of the object to be heated so that heat exchanger effectiveness (heat transfer rate) on the surface of the object to be heated is improved, thereby uniformly heating the object to be heated.

On the other hand, the Non-Patent Document 1 discloses an impingement heat transfer of a cruciform jet, which is a non-circular shape. This impingement heat transfer of a cruciform jet relates to analysis of a jet blown through a cruciform blast port, based on an isothermal transmissibility distribution and an infrared image isothermal chart. An analysis result thereby obtained verifies the occurrence of a switching phenomenon in which the cruciform jet changes its shape with time such that projecting parts of the cross shape are flattened and dented parts thereof are projected.

Prior Art Documents

Patent Document

Patent Document 1: Japanese Patent Application Publication No. 2002-331357

Non-Patent Document

Non-Patent Document 1: Impingement Heat Characteristics of Cruciform Jet, Pages 233-239, No. 607 (March, 1997), Vol. 63 Collection of Literatures (Edition B), Japan Society of Mechanical Engineers

DISCLOSURE OF THE INVENTION

Problems to be Solved by the Invention

According to the Cited Document 1, although providing a plurality of blast ports and a plurality of recovery ports makes it possible to uniformly heat the object to be heated, the fan motor output must be increased to attain a better heating efficiency for an object to be heated such as a printed board. It, however, has a disadvantage such that the larger the fan motor output is, the more its power consumption is increased. Further, the rotational speed of the motor is accelerated as the fan motor output increases, which is not desirable because it may shorten the life of the motor.

The present invention solves these technical problems and has an object of providing a nozzle of a heating device, a heating device, and a nozzle of a cooling device that can achieve an improvement of heat exchanger effectiveness (heat transfer rate) without any increase of a fan motor output.

Means for Solving the Problem

To solve the above-mentioned problems, a nozzle of a heating device in accordance with the present invention is a nozzle of a heating device, the device including: a heater for heating gas; and a blowing nozzle having an outlet for blowing the gas heated by the heater, wherein the outlet has a non-circular planar shape with a projection portion thereof being projected inwardly.

In the nozzle of the heating device in accordance with the present invention, the heater heats gas, and the heated gas is sent to the blowing nozzle by, for example, a fan. Then, the blowing nozzle blows the gas sent by the fan through the outlet. On the assumption of this, the outlet has a non-circular planar shape with a projection portion being projected inwardly. This allows a shape of the gas in cross section perpendicular to a direction where the gas is blown through the outlet of the nozzle to be changed by the projection portion with time. Accordingly, a heat quantity per unit time of the gas applied to an object to be heated increases compared to a heat quantity of gas blown through any common circular outlets. This enables to be increased the heat exchanger effectiveness (heat transfer rate) on the object to be heated, thereby improving a heating capacity.

Further, a heating device in accordance with the present invention includes a heater for heating gas, a blowing nozzle having an outlet for blowing the gas heated by the heater, the outlet having a non-circular planar shape with a projection portion thereof being projected inwardly, and a suction port for suctioning the gas blown through the outlet and reflected after hitting an object to be heated.

In the heating device in accordance with the present invention, the heater hats heats gas, and the blowing nozzle blows the gas heated by the heater through the outlet having a non-circular planar shape with a projection portion thereof being projected inwardly. On the assumption of this, the suction port suctions the gas blown through the outlet and reflected after hitting the object to be heated. This allows the gas reflected from the object to be heated to be prevented from being interrupted to the gas blown through the outlet.

Additionally, a nozzle of a cooling device in accordance with the present invention is a nozzle of a cooling device, the device including a cooling mechanism for cooling down gas; and a blowing nozzle having an outlet for blowing the gas cooled down by the cooling mechanism, wherein the outlet has a non-circular planar shape with a projection portion thereof being projected inwardly.

In the nozzle of the cooling device in accordance with the present invention, the cooling mechanism cools down gas, and the blowing nozzle blows the gas cooled down by the cooling mechanism through the outlet. On the assumption of this, the outlet has a non-circular planar shape with a projection portion thereof being projected inwardly. This allows a shape of the gas in cross section perpendicular to a direction where the gas is blown through the outlet of the nozzle to be changed by the projection portion with time. Accordingly, a heat quantity per unit time of the gas removed from an object to be cooled increases compared to a heat quantity of gas removed from an object to be cooled by gas blown through any common circular outlets. This enables to be increased heat exchanger effectiveness (heat transfer rate) on the object to be cooled, thereby improving a cooling capacity.

Effect of the Invention

According to the nozzle of the heating device in accordance with the present invention, the heat exchanger effectiveness (heat transfer rate) per unit time on an object to be heated is increased compared to a nozzle having a common circular outlet, thereby improving a heating capacity, which enables the output of the motor for rotating the fan which sends the gas heated by the heater to the nozzle to be limited. As a result thereof, power consumption of the heating device can be reduced.

Further, according to the heating device in accordance with the present invention, the gas reflected from the object to be heated is prevented from interfering with the gas blown through the outlet, thereby enabling an interruption of the gas blown through the outlet to be eliminated and the occurrence of any temperature drop of the gas and disturbance of the gas blowing direction to be avoided.

Additionally, according to the nozzle of the cooling device in accordance with the present invention, a heat exchanger effectiveness (heat transfer rate) per unit time on an object to be cooled is increased, thereby improving a cooling capacity, which enables the output of the motor for rotating the fan which sends the gas cooled down by the cooling mechanism to the nozzle to be limited. As a result thereof, power consumption of the cooling device can be reduced.

EMBODIMENTS FOR CARRYING OUT THE INVENTION

Hereinafter, a reflow soldering apparatus and a flow soldering apparatus in accordance with the present invention will be described with reference to the accompanied drawings.

Embodiment 1

<Structural Example of Reflow Soldering Apparatus 100>

Figure 1:
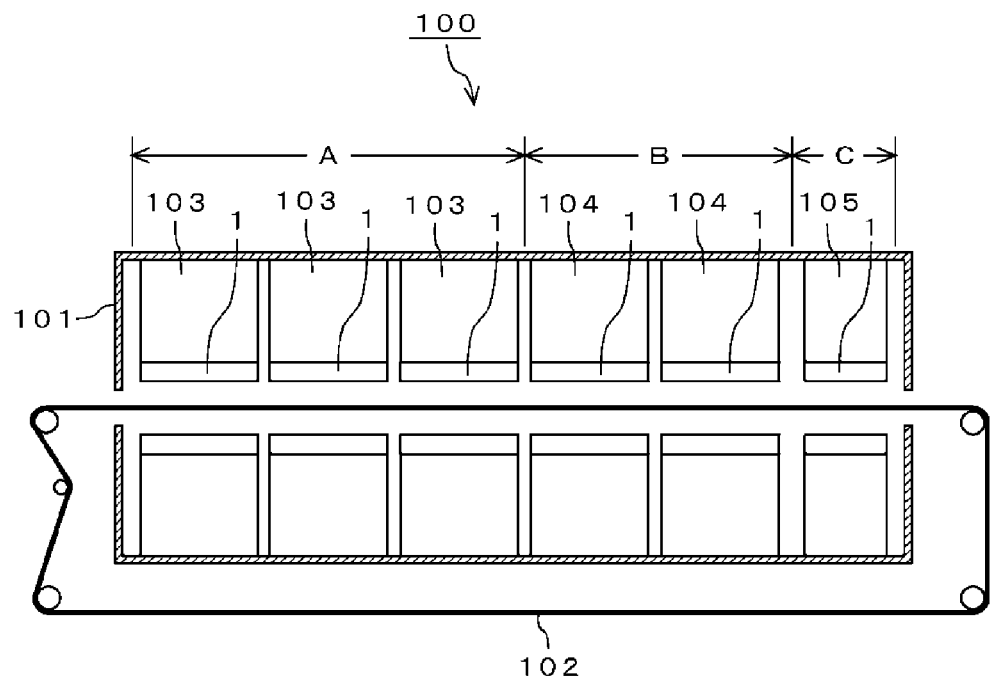
FIG. 1 is a sectional front view of a reflow soldering apparatus 100 in accordance with a first embodiment of the present invention showing a structural example thereof.

FIG. 1 is a sectional front view of a reflow soldering apparatus 100 in accordance with a first embodiment of the present invention showing a structural example thereof. As illustrated in FIG. 1, the reflow soldering apparatus 100 is composed of a body part 101, and a conveyer 102 for conveying an object to be heated such as a printed board.

The body part 101 includes three zones; a preheating zone A, a heating zone B, and a cooling zone C. The printed board subjected to a soldering treatment by the reflow soldering apparatus 100 is conveyed by the conveyer 102 to the preheating zone A, the heating zone B, and the cooling zone C in the mentioned order.

The preheating zone A is a region where the printed board and electronic parts mounted on the printed board are slowly heated so as to be adjusted to heat, and a solvent contained in a soldering paste is volatilized. The preheating zone A is set so that a lead-free solder paste has a temperature of approximately 150-180° C. although it varies depending on compositions of solder and types of the printed board. The heating zone B is a region in which a temperature thereof becomes higher (lead-free paste has a temperature of approximately 240° C.) than that of the preheating zone A and where a solder powder contained in the solder paste is melted to perform the soldering. The cooling zone C is a region where the soldered printed board is cooled down.

In the preheating zone A, first heating units (hereinafter, referred to as "heating units 103") are respectively located in three zones above and below the conveyer 102. The heating units 103 are each provided with a nozzle device 1.

In the heating zone B, second heating units (hereinafter, referred to as "heating units 104") are respectively located in two zones above and below the conveyer 102. The heating units 104 are each provided with the nozzle device 1.

Further, each of the heating units 103, 104 is composed of a heating wire heater, a fan, and a fan rotating motor, though not illustrated in the drawing, for rotating the fan. The heating units 103, 104 heat gas using, for example, the heating wire heater and discharge the heated gas into the reflow soldering apparatus 100 as hot blast by driving the fan motor to rotate the fan. The flow rate of the hot blast blown from the heating units 103, 104 is controlled by the rotational speed of the fan motor. During a normal heating operation, the temperature of the heating units 104 is set to be higher than that of the heating units 103.

In the cooling zone C, cooling units 105 are respectively provided in one zone above and below the conveyer 102. The cooling units 105 are each provided with the nozzle device 1.

Each of the cooling unit 105 is composed of a cooling mechanism having a water cooling pipe, not illustrated in the drawing, a fan, a fan motor for rotating the fan and the like. For example, the cooling units 105 cool down the water cooling piping by supplying a flow of water through the pipe of the water cooling piping and make gas contact the pipe to cool down the gas. The cooling units 105 then drive the fan motor to rotate the fan and discharge the gas cooled down by the pipe from the nozzle device 1 into the reflow soldering apparatus 100 as cold blast, thereby cooling down the soldered printed board.

It is to be noted that the number of the zones in respective preheating and heating zones A and B, the number of the heaters in the heating units 103, 104, and the upper and lower locations of the heating units are not necessarily limited to the given examples but can be suitably changed.

The above-mentioned nozzle device 1 is provided with a gas flow path, which will be described later, for flowing gas (for example, air and inactive gas such as nitrogen gas), and blowing nozzles 2, which will be described later, each having outlet(s) provided on an edge of the gas flow path.

The gas flow path flows the gas heated by the heating units 103, 104 or the gas cooled down by the cooling units 105. The outlet blows the gas flowing through the gas flow path and makes the gas hit the printed board. The outlet has a non-circular planar shape with a projection portion thereof being projected inwardly. More specifically, the outlet has a planar shape with a projection portion thereof being projected toward an inner side of a virtual circle.

Figure 2A:
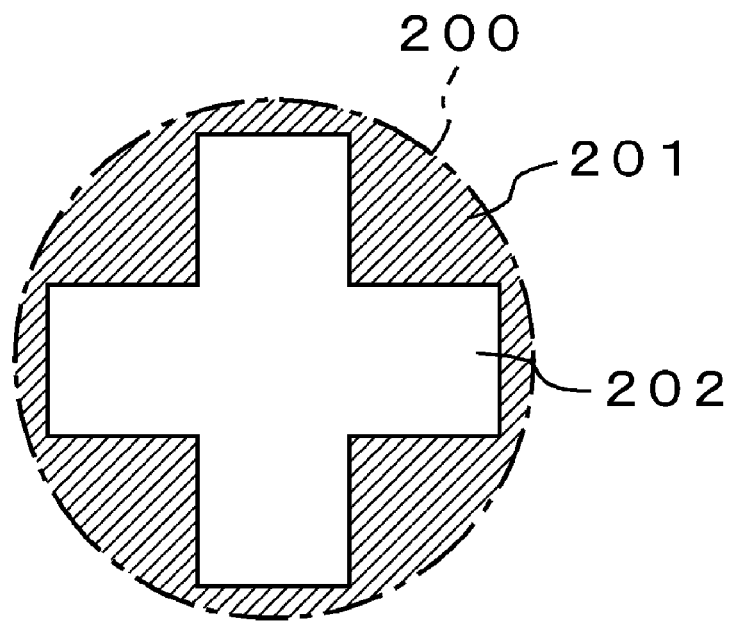
FIG. 2A is an illustration of a projection portion 201 showing an example of a shape thereof.
Figure 2B:
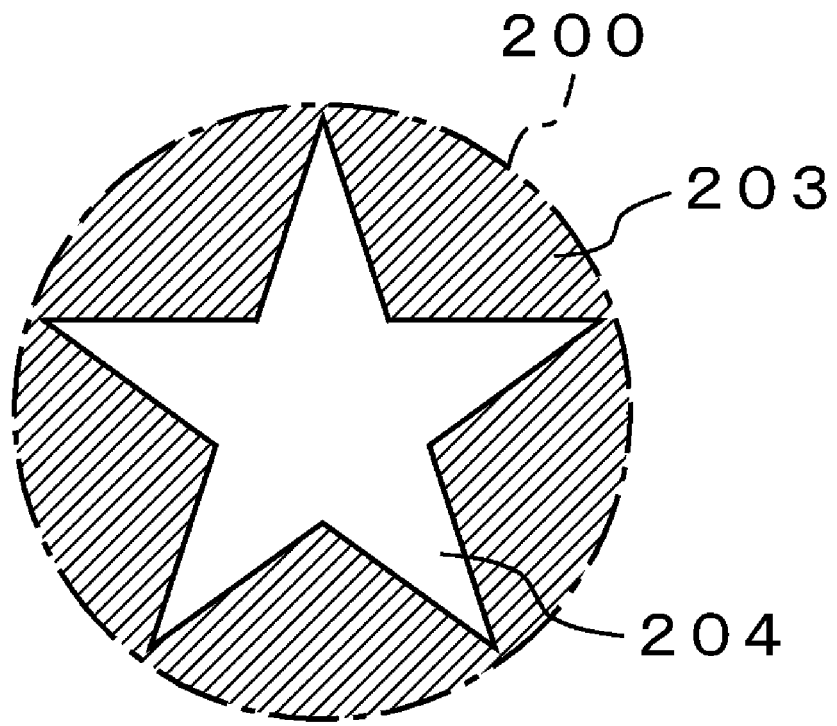
FIG. 2B is an illustration of a projection portion 203 showing an example of a shape thereof.
Figure 2C:
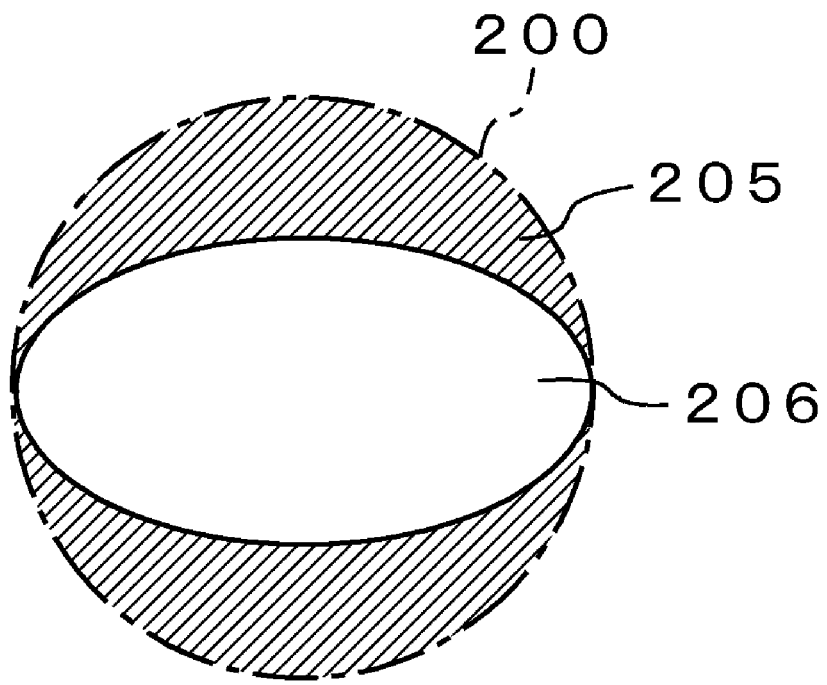
FIG. 2C is an illustration of a projection portion 205 showing an example of a shape thereof.

The following will describe the shape with the projection portion thereof being projected toward an inner side of a virtual circle. FIGS. 2A, 2B, and 2C are illustrations of the projection portions 201, 203 and 205 showing examples of the shapes thereof. As shown in FIG. 2A, the outlet provided in the above-mentioned nozzle device 1 has a planar shape with the projection portion 201 marked with slanting lines and projected from a virtual circle 200 hypothetically drawn with a dashed-dotted line toward an inner side of the virtual circle 200. By the formation of the projection portion 201, a cruciform aperture 202 is formed. Further, as shown in FIG. 2B, the outlet provided in the nozzle device 1 has a planar shape with the projection portion 203 marked with slanting lines and projected from the virtual circle 200 illustrated with a dashed-dotted line toward an inner side of the virtual circle 200. By the formation of the projection portion 203, a star-shaped aperture 204 is formed. Additionally, as shown in FIG. 2C, the outlet provided in the nozzle device 1 has a planar shape with the projection portion 205 marked with slanting lines and projected from the virtual circle 200 illustrated with a dashed-dotted line toward an inner side of the virtual circle 200. By the formation of the projection portion 205, an elliptical aperture 204 is obtained.

When the planar shape of the outlet provided in the nozzle device 1 has a shape with the projection portion thereof being projected toward the inner side of the virtual circle, a shape of gas in cross section perpendicular to a direction where the gas is blown through the outlet is changed with time by the projection portion.

Figure 3:
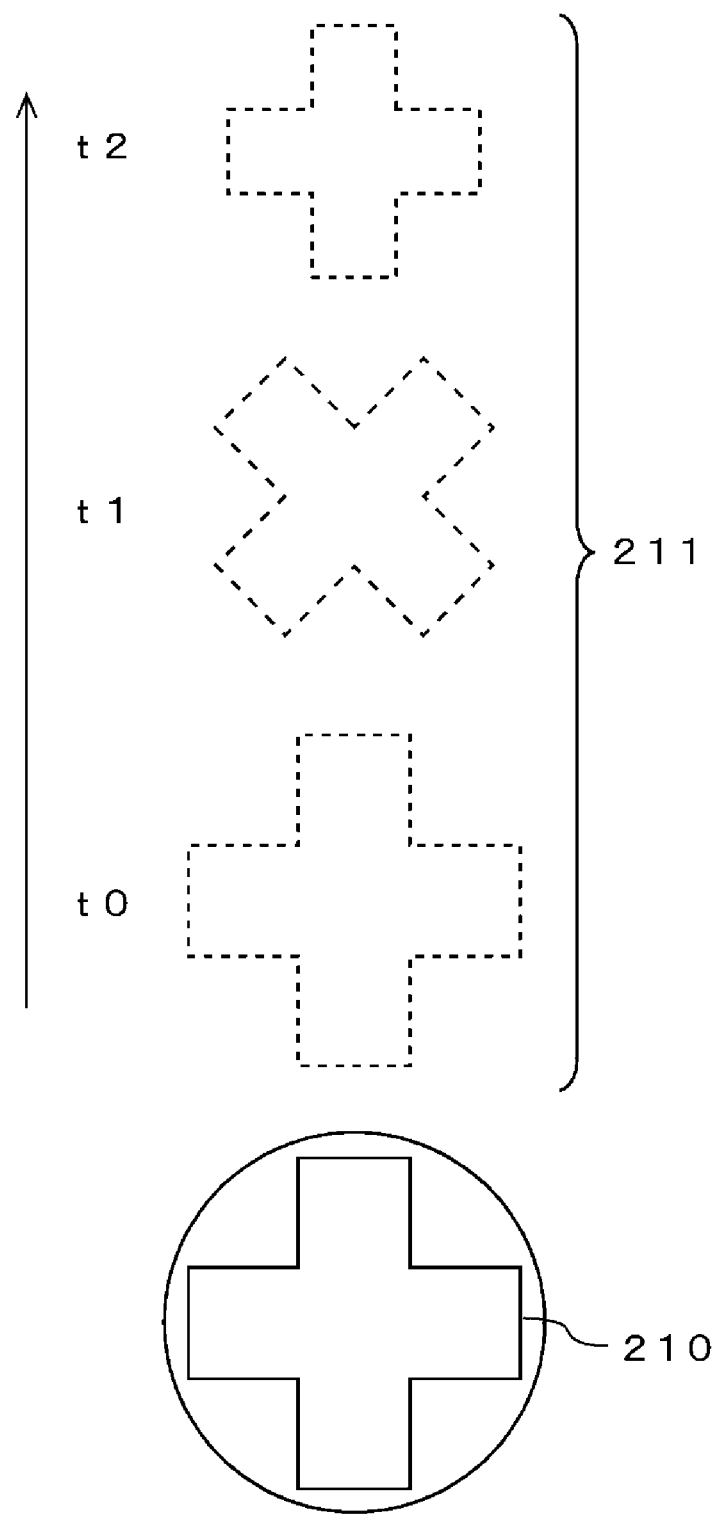
FIG. 3 is an illustration of gas 211 blown through an outlet 210 showing an example of a sectional shape thereof.

The terms, "the shape of gas in cross section is changed with time" refer to as "when the outlet 210 has a cross section of cross shape illustrated in FIG. 3, a shape of gas 211 is changed with time so as to be flat by a convex portion of the cross shape and so as to be protruded by a concave portion of the cross shape, while it is gradually decreasing its heat quantity so that the shapes illustrated at time points t1 and t2 are shown in turn (Incidentally, the gas 211 at time point t0 illustrated in FIG. 3 shows a shape immediately after being blown through the outlet 210, which is substantially equal to the shape of the outlet 210). This event may be called as a switching phenomenon. When the switching phenomenon occurs, a heat quantity of the gas has a better storage stability compared to gas blown through any common circular outlets in which the switching phenomenon does not occur (in other words, a heat quantity loss of the gas blown through the outlet 210 is lessened). Accordingly, a heat quantity per unit time of the gas applied to an object to be heated (or removed from the object to be heated) increases compared to a heat quantity of gas blown through any common circular outlets.

Namely, when the gas heated by the heating units 103, 104 is discharged, the reflow soldering apparatus 100 in accordance with the present embodiment can increase the heat quantity per unit time of the gas applied to the printed board compared to a heat quantity of the gas blown through any common circular outlets, thereby improving a heat exchanger effectiveness (heat transfer rate) on the printed board. When the gas cooled down by the cooling units 105 is discharged, it can increase the heat quantity per unit time of the gas removed from the printed board compared to a heat quantity of the gas blown through any common circular outlets, which is removed from the printed board, thereby improving a heat exchanger effectiveness (heat transfer rate) on the printed board.

When the gas heated by the heating units 103, 104 or the gas cooled down by the cooling units 105 is sent to the blowing nozzle 2 by, for example, a fan, the reflow soldering apparatus 100 in accordance with the present embodiment thus can reduce an output of the fan motor for rotating the fan which sends the gas to the blowing nozzle 2. As a result thereof, it is capable of reducing power consumption compared to that of any conventional reflow soldering apparatuses, thereby improving the life of the fan and the fan motor.

<Structural Example of Nozzle Device 1>

Figure 4:
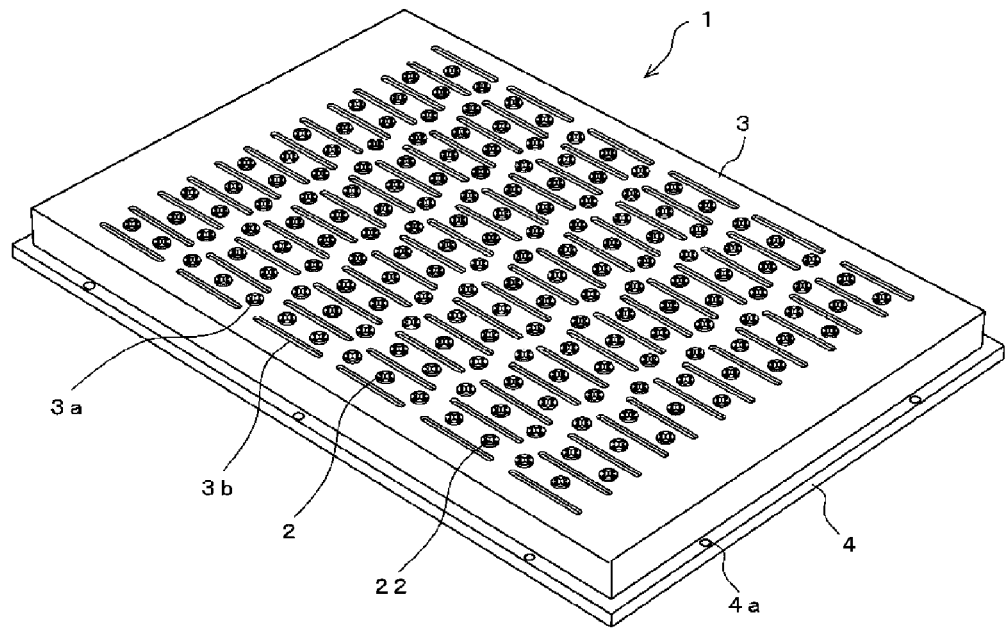
FIG. 4 is a perspective view of a nozzle device 1 showing a structural example thereof.

An example of the nozzle device 1 provided in each of the heating units 103, 104 will be described. FIG. 4 is a perspective view of the nozzle device 1 showing a structural example thereof, FIG. 5 is a plan view thereof, and FIG. 6 is a transparent front view thereof.

Figure 5:
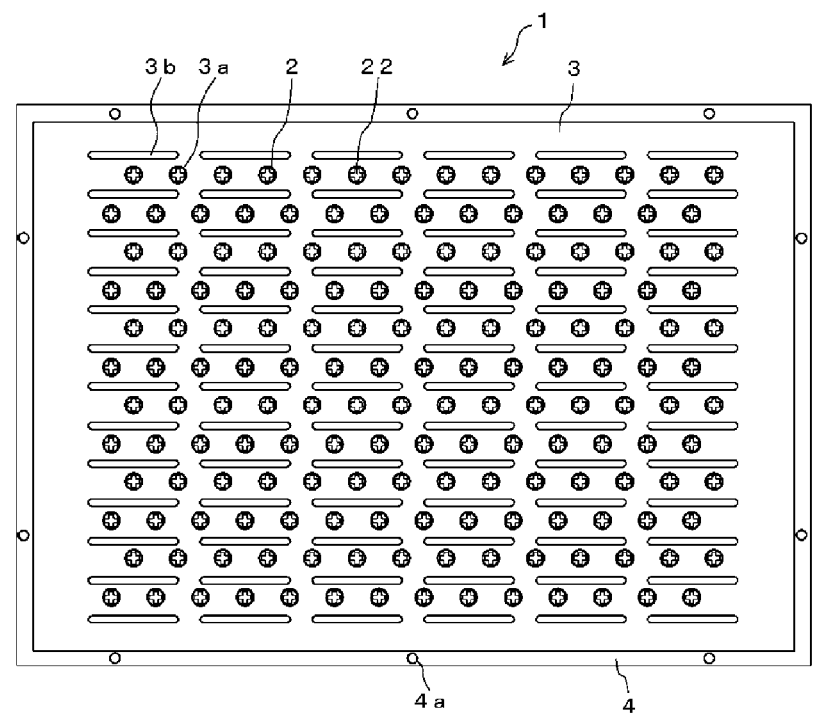
FIG. 5 is a plan view of the nozzle device 1 showing the structural example thereof.
Figure 6:
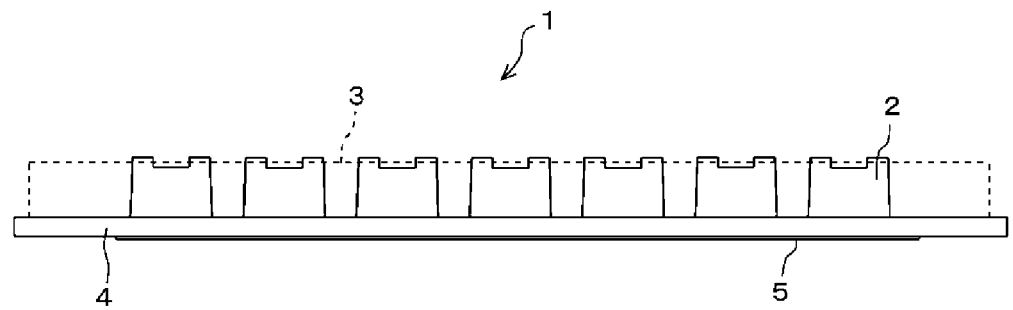
FIG. 6 is a transparent front view of the nozzle device 1 showing the structural example thereof.

As illustrated in FIGS. 4, 5, and 6, the nozzle device 1 is composed of the blowing nozzles 2, a nozzle cover 3, a fitting plate 4, and a fixing plate 5. An edge of each blowing nozzle 2 is provided with cruciform apertures (hereinafter, referred to as "cruciform apertures 22"), which are an example of the outlets. The blowing nozzles 2 blow the gas heated by the heating units 103, 104 through the cruciform apertures 22.

The blowing nozzles 2 are covered with the nozzle cover 3. The nozzle cover 3 has holes 3a for fitting the blowing nozzle and suction ports 3b provided in proximity. The holes 3a for fitting the blowing nozzle are fitted to the edges of the blowing nozzles 2. Each of the suction ports 3b has a long elliptical shape and suctions the gas pooled in the muffle and the gas blown through the blowing nozzles 2 and reflected after hitting an object such as the printed board. The gas reflected from the printed board possibly interferes with hot gas blown through any of the cruciform apertures 22. The gas reflected from the printed board, from which the heat is removed by the printed board, has a lowered temperature, and when interfering with the gas blown through any of the cruciform apertures 22, it may lower the temperature of the gas blown through the cruciform apertures 22 or disturb the direction where the gas is blown through the cruciform apertures 22. Therefore, the suction ports 3b are provided so that the gas reflected from the printed board can be immediately suctioned by the suction ports 3b. This prevents the gas reflected from the printed board from interfering with the gas blown through the cruciform apertures 22.

The fitting plate 4 is provided below the blowing nozzles 2 and the nozzle cover 3. The fitting plate 4 is used for fitting the blowing nozzles 2 and the nozzle cover 3 thereto. The fitting plate 4 has heater fitting holes 4a formed in an outer peripheral portion thereof. The heater fitting holes 4a are provided for mounting the nozzle device on the heating units 103, 104 by fitting it to the heating units 103, 104 by means of screws or the like therethrough. On both ends of the fitting plate 4 are provided suction ports 4c for recirculating the gas in the muffle suctioned through the suction ports 3b to the heating units 103, 104 (see FIGS. 11 and 12).

The fixing plate 5 is attached to a lower section of the fitting plate 4 so as to support the blowing nozzles 2 therebetween. The fixing plate 5 fixes the blowing nozzles 2 to the holes 3a for fitting the blowing nozzle of the nozzle cover 3. The nozzle cover 3 and the fitting plate 4 are fixed in a well known manner, for example, fixed by means of screws. The fixing plate 5 has fixing plate apertures 5a at positions corresponding to cruciform apertures 22 (see FIG. 11). The fixing plate apertures 5a are apertures for supplying the gas heated by the heating units 103, 104 to the blowing nozzles 2 by going it therethrough.

In accordance with the nozzle device 1 thus configured, the gas heated by the heating units 103, 104 is blown through the fixing plate apertures 5*a* of the fixing plate 5 and then blown through the cruciform apertures 22 of the blowing nozzles 2 into the muffle of the reflow soldering apparatus 100 so that the nozzle device 1 blasts the gas against the printed board to heat the printed board to a required temperature. The gas reflected after hitting the printed board is recirculated to the heating units 103, 104 through the suction ports 3*b* of the nozzle cover 3 and the suction ports 4*c* of the fitting plate 4. The recirculated gas is heated by the heating units 103, 104 again, and the hot blast thereby obtained is blown into the muffle through the blowing nozzles 2. A sequence of these steps is repeated.

On the other hand, the shape of the cruciform aperture 22 in cross section has the projection portion projected toward the inner side of the virtual circle as described earlier. Then, the gas shape in cross section perpendicular to the direction where the gas is blown through any of the cruciform apertures 22 is changed with time by the projection portion. Namely, by the occurrence of switching phenomenon, the heat quantity per unit time of the gas applied to the printed board is increased compared to a heat quantity of gas blown through any common circular outlets, thereby enabling to be improved the heat exchanger effectiveness (heat transfer rate) on the printed board.

When the gas heated by the heating units 103, 104 is blown and sent by, for example, the fan to the blowing nozzles 2, the nozzle device 1 in accordance with the present embodiment can reduce the output of the fan motor which rotates the fan sending the gas to the blowing nozzles 2. As a result thereof, mounting the nozzle device 1 on the reflow soldering apparatus enables the power consumption to be reduced compared to that of the conventional reflow soldering apparatuses, thereby improving a life of the fan motor.

Further, since the suction ports 3*b* suction the gas blown through the cruciform apertures 22 and reflected after hitting the printed board, the nozzle device 1 can prevent the gas reflected from the printed board from interfering with the gas blown through the cruciform apertures 22. Thus, the nozzle device 1 can prevent the gas reflected from the printed board from interfering with the gas blown through the cruciform apertures 22, can prevent it from lowering the gas temperature and can prevent it from disturbing the gas blowing direction.

Furthermore, although the nozzle device 1 in accordance with the present embodiment has been described relating to the heating units 103, 104, the nozzle device 1, when it is provided in any of the cooling units 105, allows the heat quantity per unit time of the gas removed from the printed board to increase compared to a heat quantity of the gas blown through any common circular outlets, which is removed from the printed circuit board, thereby enabling the heat exchanger effectiveness (heat transfer rate) on the printed board to be improved. Thus, the output of the fan motor for rotating the fan which sends the gas to the blowing nozzles 2 can be reduced. As a result thereof, it is capable of reducing power consumption compared to conventional reflow soldering apparatuses, thereby lengthening the life of the fan and the fan motor.

<Structural Example of Blowing Nozzle 2>

Figure 7:
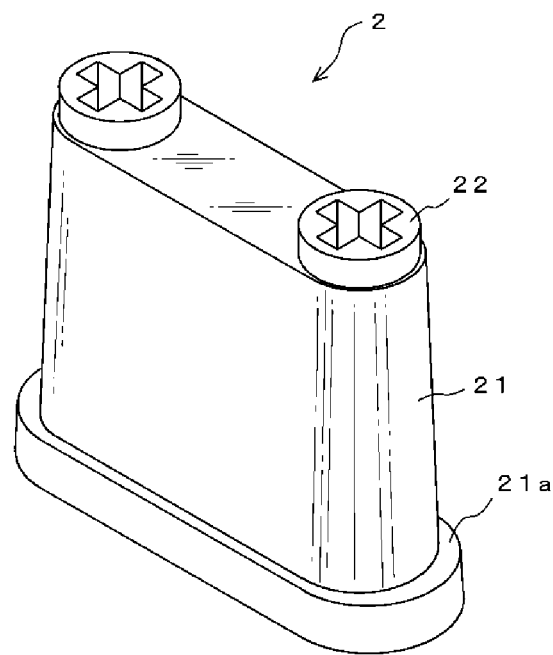
FIG. 7 is a perspective view of a blowing nozzle 2 showing a structural example thereof.

Next, a structural example of the blowing nozzle 2 will be described. FIG. 7 is a perspective view of the blowing nozzle 2 showing a structural example thereof. As illustrated in FIG. 7, the blowing nozzle 2 is composed of a nozzle body part 21 and cruciform apertures 22. The nozzle body part 21 has a convex portion 21*a* in a bottom part thereof. The nozzle body part 21 is made of metal having a good thermal conductivity such as copper or aluminum. This convex portion 21*a* is used when fitted in hole 4*b* for fitting the nozzle of the fitting plate 4 which will be described later referring to FIG. 11. The nozzle body part 21 is then provided with a gas flow path 24 (see FIG. 10). The gas flow path 24 is provided to flow the gas heated by the heating units 104, 105 or the gas cooled down by the cooling units 105 up to the cruciform apertures 22 on the edge of the nozzle.

The present embodiment provides two cruciform apertures 22 in the nozzle body part 21. Each of the cruciform apertures 22 has a function of changing with time the gas shape in cross section perpendicular to the direction where the gas is blown through the cruciform apertures 22.

Figure 8:
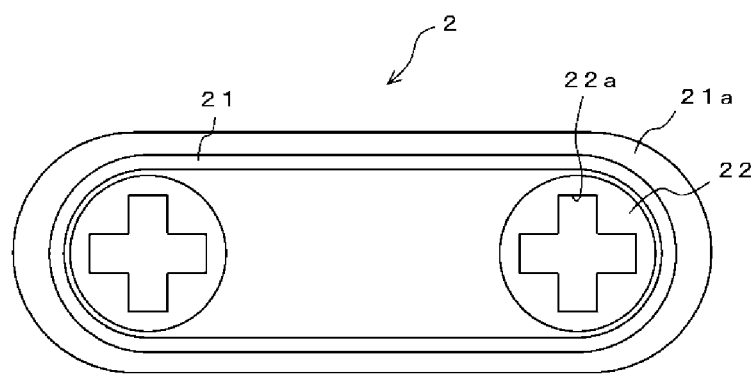
FIG. 8 is a plan view of the blowing nozzle 2 showing the structural example thereof.
Figure 9:
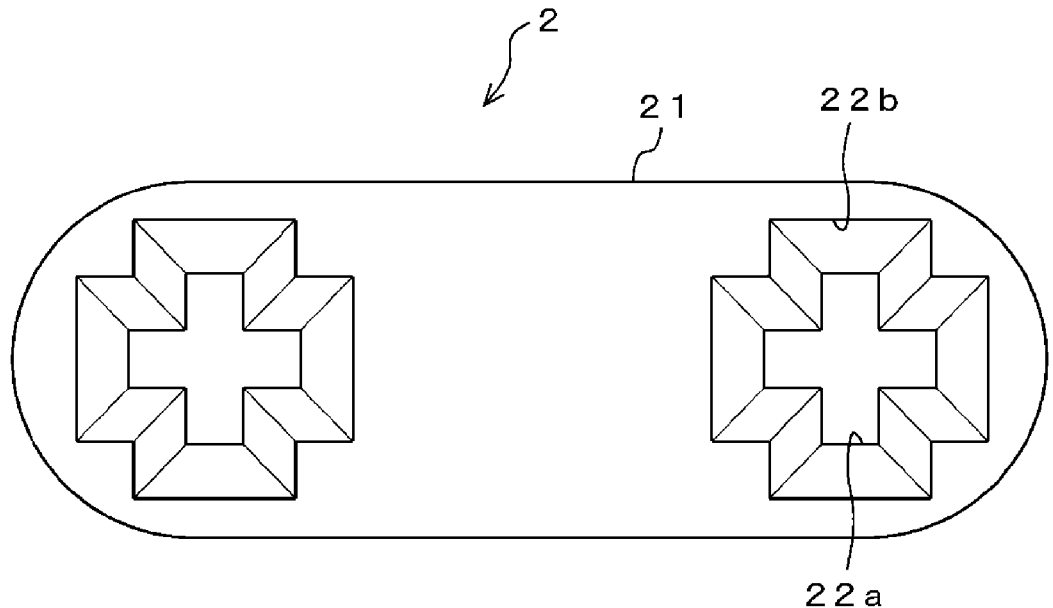
FIG. 9 is a bottom view of the blowing nozzle 2 showing the structural example thereof.
Figure 10:
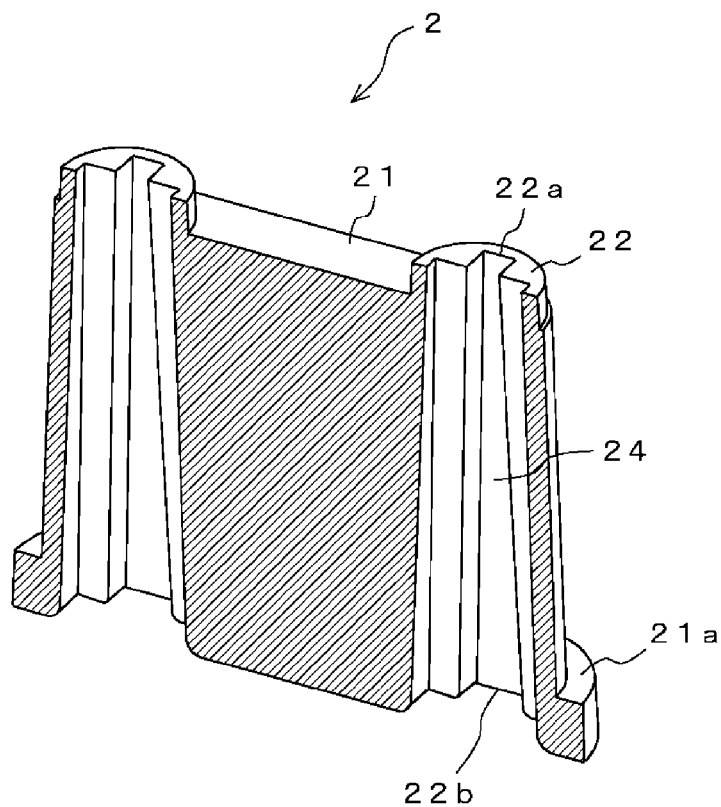
FIG. 10 is a sectional perspective view of the blowing nozzle 2 showing the structural example thereof.

FIG. 8 is a plan view of the blowing nozzle 2 showing the structural example thereof, FIG. 9 is a bottom view thereof, and FIG. 10 is a sectional perspective view thereof. As illustrated in FIGS. 8 and 9, a rear end of the cruciform aperture 22 for supplying the gas therethrough (hereinafter, referred to as "cruciform-hole lower section 22*b*") has a dimensionally larger cross shape than a top end of the cruciform aperture 22 for blowing the gas therethrough (hereinafter, referred to as "cruciform-hole upper section 22*a*"). Namely, as illustrated in FIG. 10, the cruciform aperture 22 is tilted from the cruciform-hole lower section 22*b* for supplying the gas therethrough up to the cruciform-hole upper section 22*a* for blowing the gas therethrough. The gas flow path 24 inside the nozzle body part 21 also has a cross shape.

The blowing nozzle 2 thus configured blows the gas heated by the heating units 103, 104 or the gas cooled down by the cooling units 105 from the fixing plate apertures 5*a* of the fixing plate 5 and further through the cruciform apertures 22 and the gas flow paths 24 of the blowing nozzle 2 into the muffle of the reflow soldering apparatus 100, and then hits the gas to the printed board. The shape of the cruciform aperture 22 in cross section has the projection portion toward the inner side of the virtual circle as described earlier. Thus, the gas shape in cross section perpendicular to the direction where the gas is blown through the cruciform aperture 22 is changed with time by the projection portion (switching phenomenon). Accordingly, in a case of the gas heated by the heating units 103, 104, the heat quantity per unit time of the gas applied to the printed board increases compared to a heat quantity of the gas blown through any common circular outlets, thereby improving a heat exchanger effectiveness (heat transfer rate) on the printed board. Further, in a case of the gas cooled down by the cooling units 105, the heat quantity per unit time of the gas removed from the printed board is increased compared to a heat quantity of the gas blown through any common circular outlets, which is removed from the printed board, thereby improving a heat exchanger effectiveness (heat transfer rate) on the printed board.

Therefore, when the gas heated by the heating units 103, 104 or the gas cooled down by the cooling units 105 is sent to the blowing nozzles 2 by, for example, the fan, the nozzles 2 in accordance with the present embodiment can reduce the output of the fan motor for rotating the fan which blows the gas to the blowing nozzles 2. As a result thereof, by mounting the nozzles 2 on the reflow soldering apparatus, it is possible to reduce power consumption compared to that of any conventional reflow soldering apparatuses, which improves life of the fan and the fan motor.

<Example of Assembly of Nozzle Device 1>

Figure 11:
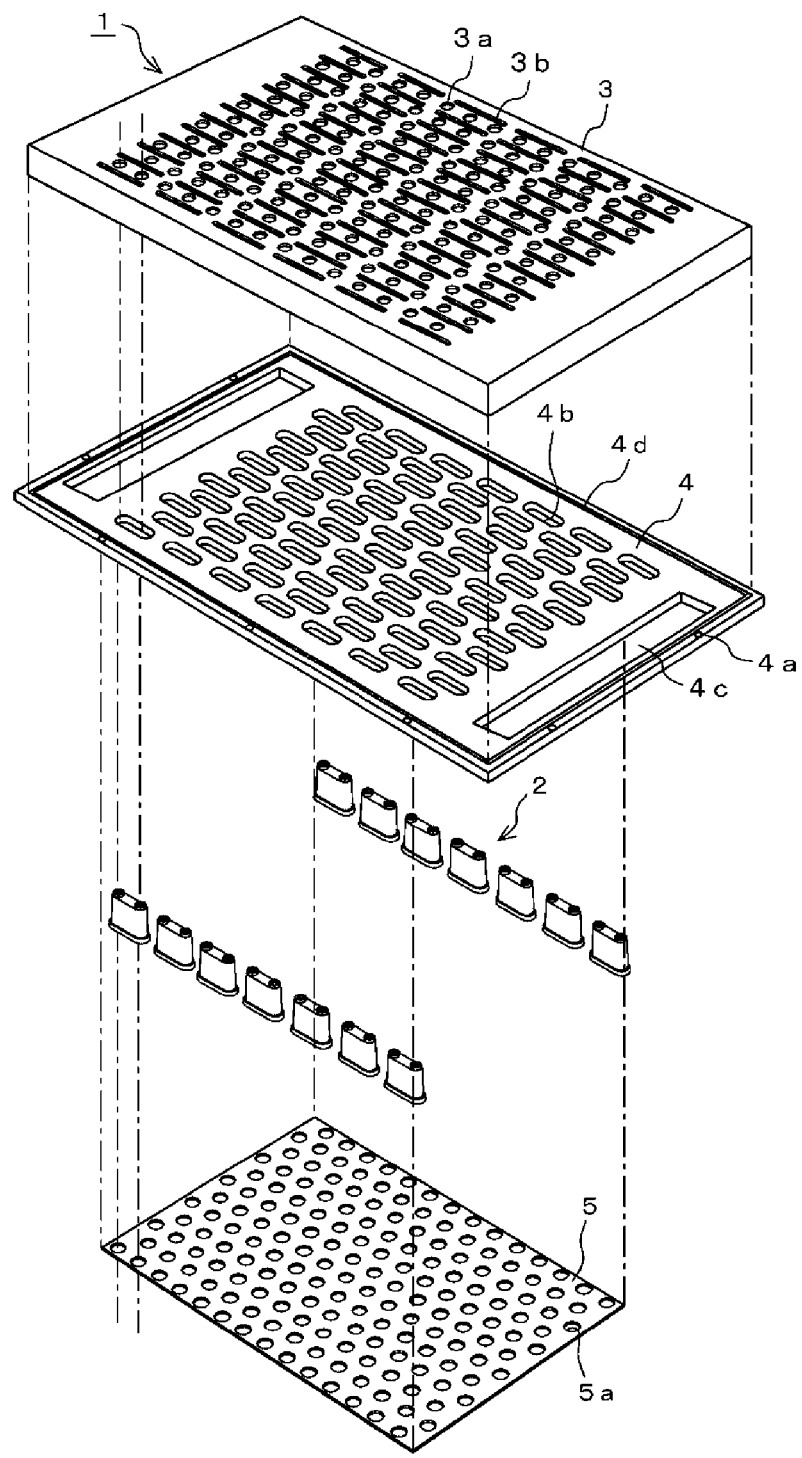
FIG. 11 is an exploded perspective view of the nozzle device 1 illustrating an example of assembly thereof.
Figure 12:
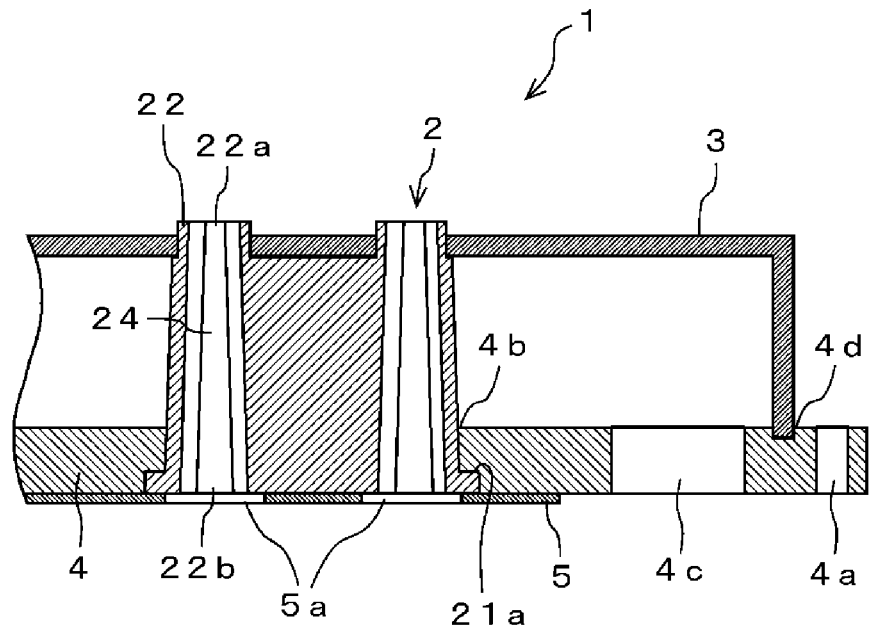
FIG. 12 is a sectional view of the assembled nozzle device 1 showing main components thereof.

Next, an example of assembly of the nozzle device 1 to be mounted on the heating unit 103, 104 will be described. FIG. 11 is an exploded perspective view of the nozzle device 1 illustrating an example of the assembly thereof. FIG. 12 is a sectional view of the assembled nozzle device 1 showing main components thereof. As illustrated in FIG. 11, the nozzle device 1 is composed of the blowing nozzles 2, the nozzle cover 3, the fitting plate 4 and the fixing plate 5.

The blowing nozzles 2 are each provided with the cruciform apertures 22 in the nozzle body part 21. The cruciform aperture 22 may be formed by drilling after the nozzle body part 21 is produced using die casting method or the like, or the nozzle body part 21 and the cruciform apertures 22 may be formed at once by die casting method or the like. FIG. 11 omits a part of the blowing nozzles 2 to simplify the illustration.

The holes 3a for fitting the blowing nozzle and the suction ports 3b are formed in the nozzle cover 3. The hole 3a for fitting the blowing nozzle has a diameter slightly larger than that of the cruciform-hole upper section 22a so as to surround the cruciform-hole upper section 22a when fitted therein. Each suction port 3b having a long elliptical shape is formed near the holes 3a for fitting the blowing nozzle to be located near the blowing nozzles 2. The holes 3a for fitting the blowing nozzle and the suction ports 3b may be formed by perforating the nozzle cover 3 or may be formed by punching the nozzle cover 3 using a press die.

The heater fitting holes 4a, the holes 4b for fitting the nozzle and the suction ports 4c are formed in the fitting plate 4. The hole 4b for fitting the nozzle is dimensionally smaller than an outer periphery of the convex portion 21a so as to abut the convex portion 21a provided in the rear end of the blowing nozzle 2. When the blowing nozzle 2 is slightly pushed in the hole 4b for fitting the nozzle, the blowing nozzle 2 can be tentatively secured to the fitting plate 4 during the assembling of the nozzle device 1. This facilitates handling when the fixing plate 5 is fitted to the fitting plate 4, which will be described later.

The suction ports 4c are provided to recirculate the gas suctioned through the suction ports 3b of the nozzle cover 3 to the heating units 103, 104. Similar to the above-mentioned nozzle cover 3, the heater fitting holes 4a, the holes 4b for fitting the nozzle and the suction ports 4c may be formed in the fitting plate 4 by drilling or may be formed in the fitting plate 4 by punching using a press die. Further, the fitting plate 4 is provided with a fitting groove 4d in an outer peripheral portion thereof. To the fitting groove 4d, an outer peripheral portion of the nozzle cover 3 covering the upper section of the fitting plate 4 is fitted. By the fitting groove 4d, it is possible to assemble the nozzle cover 3 in the fitting plate 4 without any positional displacement.

The fixing plate apertures 5a are formed in the fixing plate 5. The fixing plate aperture 5a is a hole which is dimensionally larger than the cruciform-hole lower section 22b and is provided to send the gas heated by the heater units 103, 104 to the cruciform-hole lower section 22b to discharge the hot blast into the muffle of the reflow soldering apparatus 100 through the cruciform apertures 22. Similar to the nozzle cover 3 and the fitting plate 4, the fixing plate apertures 5a may be formed by perforating the fixing plate 5 by a drill or may be formed by punching the fixing plate 5 using a press die. The methods for producing the nozzle cover 3, the fitting plate 4 and the fixing plate 5 may be suitably modified. It is to be noted that the shape of the fixing plate aperture 5a is not necessarily limited to a circular shape but may be a cross shape similar to the shape of the cruciform-hole lower section 22b.

Premised on that the blowing nozzles 2, the nozzle cover 3, the fitting plate 4, and the fixing plate 5 are formed as described so far, the blowing nozzles 2 are fitted into the holes 4b for fitting the nozzle of the fitting plate 4, as illustrated in FIG. 11, passing therethrough the cruciform-hole upper section 22a. Then, the lower section of the hole 4b for fitting the nozzle abuts the convex portion 21a in the rear end of each of the blowing nozzles 2 so that the blowing nozzles 2 are fitted in the fitting plate 4.

Next, the fixing plate 5 is attached to the lower sections of the fitted blowing nozzles 2 and the fitting plate 4. The screws are threaded into threaded holes of the fixing plate 5, not illustrated in the drawings, so that the fixing plate 5 is attached to the fitting plate 4 with the blowing nozzles 2 being supported therebetween, which enables the blowing nozzles 2, the fitting plate 4 and the fixing plate 5 to be integrated with one another.

Finally, the upper section of the blowing nozzles 2, the fitting plate 4 and the fixing plate 5, which are integrated together, are covered with the nozzle cover 3. Since the fitting groove 4d is formed in the fitting plate 4 as illustrated in FIG. 12, the nozzle cover 3 is not positionally displaced from the fitting plate 4 when the outer peripheral portion of the nozzle cover 3 is fitted in the fitting plate 4. The nozzle cover 3 and the fitting plate 4 are fixed in a well known manner, for example, by means of screws. In accordance with the method described so far, the nozzle device 1 can be readily assembled.

Incidentally, the blowing nozzles 2, the fitting plate 4, the fixing plate 5 and the nozzle cover 3 may be joined with one another by welding. Alternatively, the blowing nozzles 2 may be directly engaged with the nozzle cover 3 by means of screws and thereby securely fixed to the nozzle cover to omit the fitting plate 4. The assembling method of the nozzle device 1 is not limited to this embodiment but may be suitably modified.

<Exemplified Characteristics of Nozzle Device 1>

Figure 13:
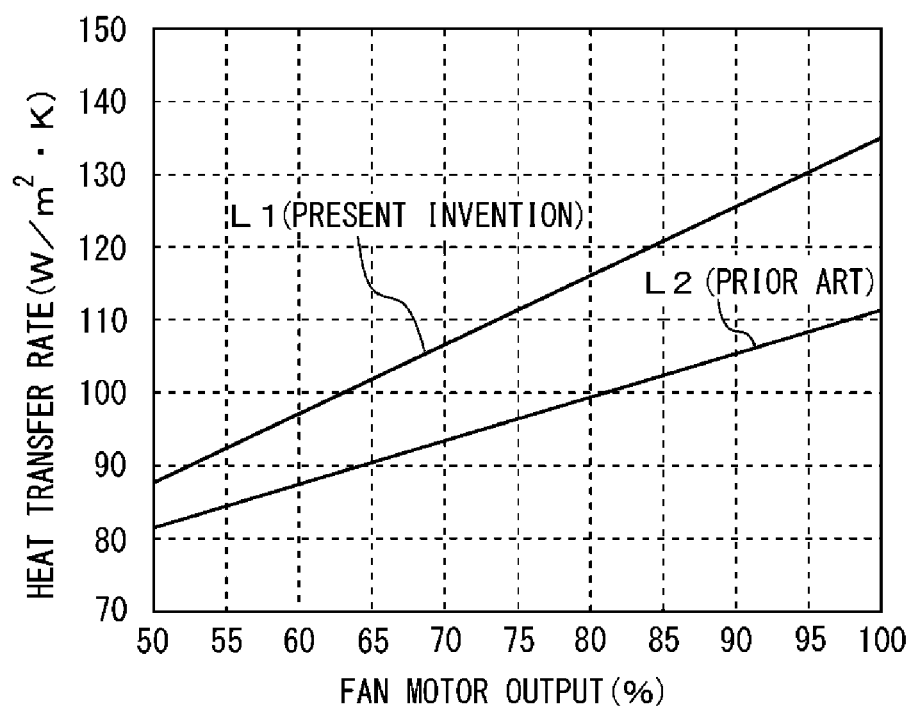
FIG. 13 is an illustration of exemplified characteristics of the nozzle device 1.

Next, exemplified characteristics of the nozzle device 1 will be described. FIG. 13 is an illustration of exemplified characteristics of the nozzle device 1, wherein a longitudinal axis represents the heat transfer rate and a lateral axis represents the output of the fan motor for rotating the fan, which is provided in the heater or cooling unit. As illustrated in FIG. 13, characteristics L1 of the nozzle device 1 provided with the outlets having the cross shape in accordance with the present invention show an inclination extremely more than that of characteristics L2 of a nozzle device provided with conventional outlets each having a circular shape. This indicates that the characteristics L1 accelerated the heat transferability compared to the conventional characteristics L2.

When, for example, a conventional nozzle device, wherein the fan motor output is 100%, blows gas to the printed board, the heat transfer rate of the conventional noise device is approximately 112 W/(m$^2$K). Referring to the characteristics L1 of the nozzle device 1 in accordance with the present invention when the heat transfer rate is approximately 112 W/(m$^2$K), the fan motor output is approximately 75%. Namely, when the conventional nozzle device needs the fan motor output of 100% to achieve an expected performance, the nozzle device in accordance with the present invention requires the fan motor output of approximately 75%, which results in a reduction of power consumption by approximately 25%.

One of the reasons why the nozzle device 1 in accordance with the present invention achieves such a favorable heat transfer rate is that each of the outlets of the nozzle device 1 has the cross shape (cruciform aperture 22). The gas blown from each of the blowing nozzles 2 through the cruciform outlets thereof changes its shape in cross section perpendicular to the gas blowing direction with time (switching phenomenon). The occurrence of the switching phenomenon increases the heat quantity per unit time of the gas applied to the printed board compared to a heat quantity of gas blown through common circular outlets, thereby improving the heat transferability.

In accordance with the reflow soldering apparatus 100 accomplished by the first embodiment, the heating units 103, 104 heat the gas, the cooling units 105 cool down the heated gas and the blowing nozzles 2 blow the gas heated by the heating units 103, 104 or the gas cooled down by the cooling units 105 through the non-circular outlets (cruciform apertures 22) each provided with the projection portion which is projected inwardly. On the assumption of this, the suction ports 3b suction the gas blown through the cruciform apertures 22 and reflected after hitting the printed board. This can prevent the gas reflected from the printed board from interfering with the gas blown through the cruciform apertures 22. As a result thereof, the gas reflected from the printed board is prevented from interrupting the gas blown through the cruciform apertures 22, which enables a drop in the gas temperature or any disturbance of the gas blowing direction to be avoided.

Further, in the nozzle device 1 in accordance with the present embodiment, the gas heated by the heating units 104, 105 or the gas cooled down by the cooling units 105 is blown to the blowing nozzles 2 using the fan. The blowing nozzles 2 blow the gas sent by the fan through the cruciform apertures 22. On the assumption of this, the cruciform aperture 22 has the non-circular planar shape with the projection portion thereof being projected inwardly. Thus, the gas shape in cross section perpendicular to the direction where the gas is blown through the cruciform aperture 22 of each of the blowing nozzles 2 is changed with time by the projection portion (switching phenomenon). The occurrence of the switching phenomenon increases the heat quantity per unit time of the gas applied to a printed board in a case of the gas heated by the heating units 103, 104 compared to a heat quantity of the gas blown through any common circular outlets. This enables the heat exchanger effectiveness (heat transfer rate) on the printed board to be increased. Further, in a case of the gas cooled down by the cooling units 105, the heat quantity per unit time of the gas removed from the printed board increases compared to a heat quantity of the gas blown through any common circular outlets, which is removed from the printed board. This enables the heat exchanger effectiveness (heat transfer rate) on the printed board to be increased.

As a result thereof, it is possible to reduce the output of the fan motor for rotating the fan which sends the gas heated by the heating units 104, 105 or the gas cooled down by the cooling units 105 to the nozzles. As a result thereof, power consumption in the reflow soldering apparatus can be decreased, and the life of the fan and the fan motor can be thereby lengthened.

It is to be noted that although, in the present embodiment, the blowing nozzle has been describes in which the nozzle body part 21 is provided with two cruciform apertures 22, the nozzle body part 21 may be provided with only one cruciform aperture 22 or three or more cruciform apertures 22. It facilitates location changes of the cruciform aperture 22 when providing the nozzle body part 21 with one cruciform aperture 22. Further, flexibly increasing or decreasing the number of the cruciform apertures 22 provided in the nozzle device 1 allows any sudden design changes to be met. In the case where the nozzle body part 21 is provided with at least three cruciform apertures 22, manufacturing costs can be reduced because of less structural components in total.

Further, although, in the present embodiment, the outlet and the gas flow path have been described so as to have the cross shape in cross section, they may be configured so as to have another shape such as an elliptical shape, a star shape or a polygonal shape.

Additionally, although, in the present embodiment, the blowing nozzle 2 having the nozzle body part 21 and the cruciform apertures 22 integrated together has been described, the nozzle body part 21 and the cruciform apertures 22 may be separately formed.

Embodiment 2

This embodiment describes a nozzle device 1A wherein the shape of each of the suction ports 3b of the nozzle device 1 described in the first embodiment is modified. All of structural components called likewise and illustrated with the same reference symbols as those described in the first embodiment are functionally equal and, therefore, will be omitted.

Figure 14:
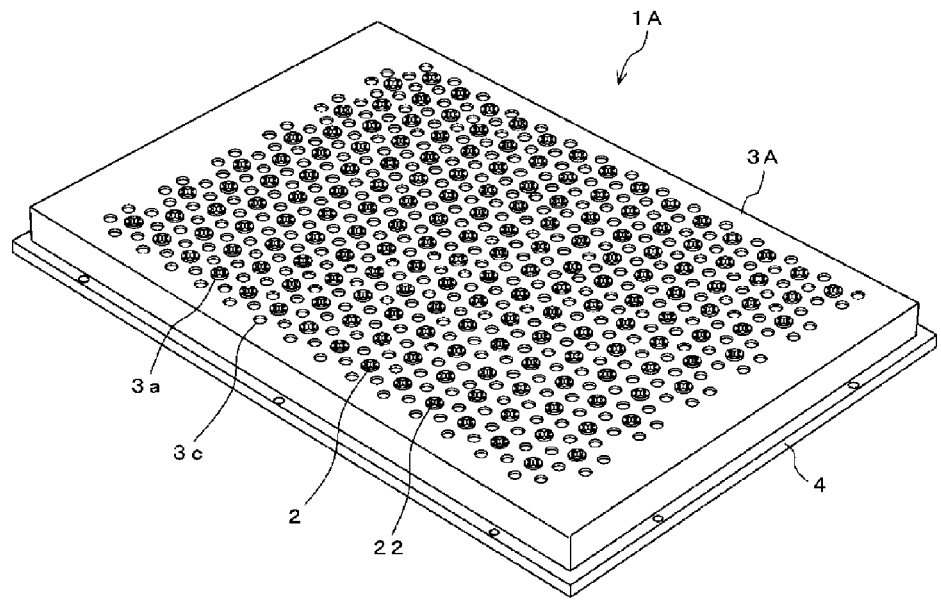
FIG. 14 is a perspective view of a nozzle device 1A in accordance with a second embodiment of the present invention showing a structural example thereof.

FIG. 14 is a perspective view of the nozzle device 1A in accordance with a second embodiment of the present invention showing a structural example thereof. As illustrated in FIG. 14, the nozzle device 1A is composed of blowing nozzles 2 and a nozzle cover 3A. The blowing nozzles 2 are equal to the blowing nozzles described in the first embodiment.

The nozzle cover 3A has holes 3a for fitting the blowing nozzle and suction ports 3c. Each of the suction ports 3c has a circular shape and is formed near the hole 3a for fitting the blowing nozzle so that it is located near the blowing nozzle 2. The suction ports 3c suction the gas pooled in the muffle and the gas blown through the blowing nozzles 2 and reflected after hitting the printed board.

In accordance with the present embodiment, the suction port 3c is provided in the circumcenter of circumscribed circles drawn around three holes 3a for fitting the blowing nozzle adjacent to one another.

Thus, by the nozzle device 1A in accordance with the second embodiment, the blowing nozzles 2 have the cruciform apertures 22 on edges thereof and blow out the gas through the cruciform apertures 22 to blow against the printed board. Each of the suction ports 3c has a circular shape and is located near each of the blowing nozzles 2 to suction the gas blown through the blowing nozzles 2 and reflected after hitting the printed board.

Accordingly, since the suction port 3c is positioned so as to be more distant from the adjacent three holes 3a for fitting the blowing nozzle, the suctioned gas and the blown-out gas hardly interfere with each other. Namely, the suction ports 3c suction a large quantity of the gas reflected from the printed board. As to the gas heated by the heating units and blown through the cruciform apertures 22, the nozzle device 1A prevents the gas reflected after hitting the printed board from lowering the temperature of the gas blown through the cruciform apertures 22. Further, when the gas cooled down by the cooling units is blown through the cruciform apertures 22, the nozzle device 1A prevents the gas reflected after hitting the printed board from increasing the temperature of the gas blown through the cruciform apertures 22. This results in a smaller difference between any temperature of the gas set by a user and an actual temperature of the gas blown against the printed board.

It is to be noted that although, in the above-mentioned first and second embodiments, the nozzle devices 1 and 1A having the nozzle covers 3 and 3A respectively provided with many suction ports 3b and 3C in the nozzle covers 3, 3A have been described, the nozzle device may have large suction ports on both end sides or at given positions thereof like the fitting plate 4, in place of providing such a larger number of suction ports. The size of the suction port can be suitably modified.

Embodiment 3

This embodiment describes a nozzle where the shape of the blowing nozzle 2 described in the first embodiment is modified. All of structural components called likewise and illustrated with the same reference symbols as those described in the first embodiment are functionally equal and, therefore, will be omitted.

Figure 15:
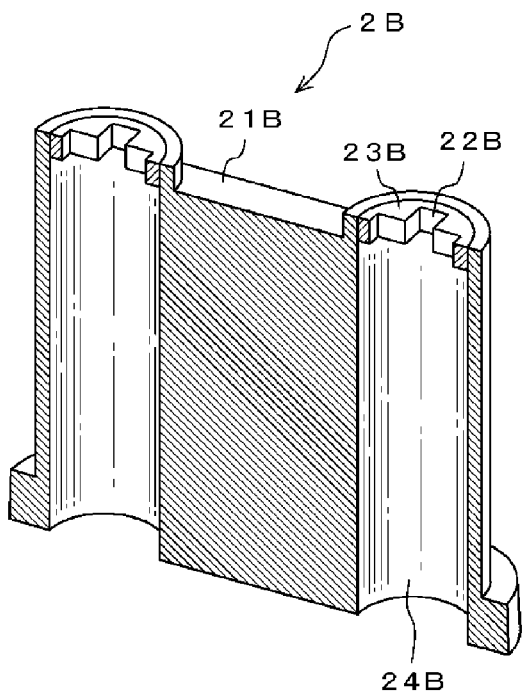
FIG. 15 is a sectional perspective view of a blowing nozzle 2B in accordance with a third embodiment of the present invention showing a structural example thereof.

FIG. 15 is a sectional perspective view of a blowing nozzle 2B in accordance with a third embodiment of the present invention showing a structural example thereof. As illustrated in FIG. 15, the blowing nozzle 2B is composed of a nozzle body part 21B and cruciform aperture members 23B.

In a manner different to the nozzle body part 21 where the cruciform apertures are integrally formed, the nozzle body part 21B is such that the cruciform aperture members 23B are fitted in edge portions of columnar gas flow paths 24B. The nozzle body part 21B is made of metal having a good thermal conductivity such as aluminum or copper. The gas flow paths 24B may be drilled by punching using a press die or may be formed by die casting or the like. The nozzle body part 21B can be more easily produced than the nozzle body part 21.

The cruciform aperture member 23B is obtained by forming a cruciform aperture 22B in a plate member. The cruciform aperture 22B has a non-circular planar shape with projection portions thereof being projected inwardly. Further, the cruciform aperture 22B is drilled by punching using a press die, for example. Additionally, to avoid any deformation or the like due to different coefficients of thermal expansion, the cruciform aperture members 23B and the nozzle body part 21B are preferably formed from the same metal.

The blowing nozzle 2B can be assembled by fitting the cruciform aperture members 23B in upper sections of the nozzle body part 21B thus formed. This allows a manufacturing cost of the blowing nozzle 2B to be reduced. This also allows costs of the nozzle device and the reflow soldering apparatus in which the blowing nozzles 2B are mounted to be reduced.

The blowing nozzle 2B thus formed has a heat transfer rate and fan motor output characteristics similar to those of the blowing nozzle 2 described earlier (see FIG. 13). The reason why such characteristics are obtained will be described. The cruciform aperture 22B has a non-circular planar shape with a projection portion thereof being projected inwardly, and a shape of the gas in cross section perpendicular to a direction where the gas is blown out through any of the cruciform apertures 22B is changed with time by the projection portion (switching phenomenon). Then, in a case of the gas heated by the heating units, a heat quantity per unit time of the gas applied to the printed board increases compared to a heat quantity of gas blown through any common circular outlets. This improves heat exchanger effectiveness (heat transfer rate) on the printed board. In contrast, in a case of the gas cooled down by the cooling units, a heat quantity per unit time removed from the printed board increases compared to a heat quantity removed from the printed board by the gas blown through any common circular outlets. This achieves an improvement of heat exchanger effectiveness (heat transfer rate) on the printed board.

Thus, the blowing nozzle 2B can reduce the output of fan motor for rotating the fan which blows the gas heated by the heating units or the gas cooled down by the cooling units to the nozzle. As a result thereof, this enables any power consumption in the reflow apparatus to be reduced, thereby improving the life of the fan and the fan motor.

Embodiment 4

This embodiment will describe a cruciform-perforated plate 10 that can replace the nozzle devices 1 and 1A which have been described in the first and second embodiments.

Figure 16:
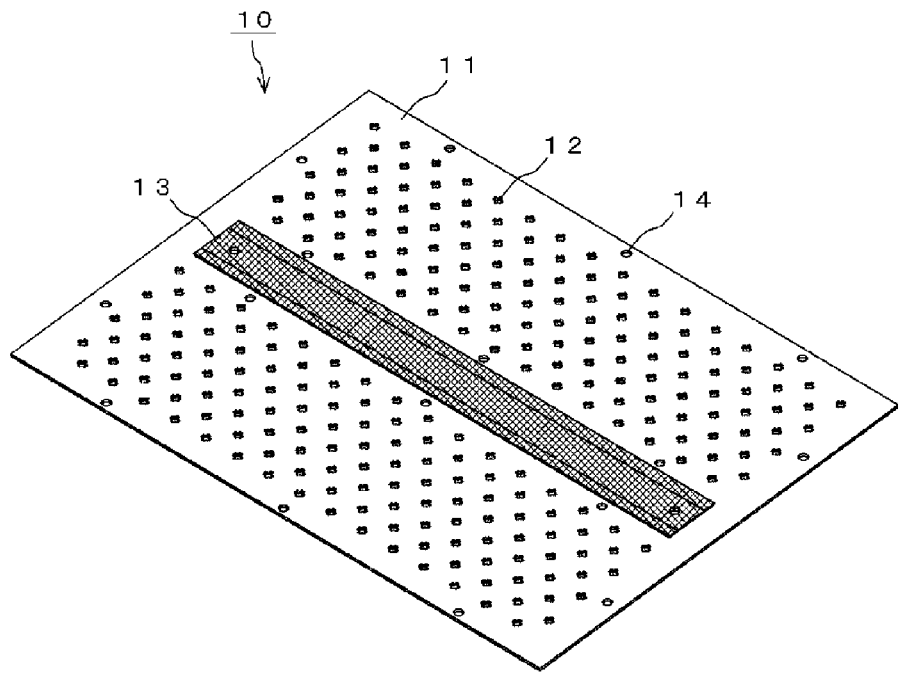
FIG. 16 is a perspective view of a cruciform-perforated plate 10 in accordance with a forth embodiment of the present invention showing a structural example thereof.

FIG. 16 is a perspective view of a cruciform-perforated plate 10 in accordance with a forth embodiment of the present invention showing a structural example thereof. As illustrated in FIG. 16, the cruciform-perforated plate 10 is composed of a plate body part 11, cruciform apertures 12, a suction port 13, and fitting holes 14. The cruciform-perforated plate 10 can replace the nozzle devices 1 and 1A described in the above-mentioned embodiments 1 and 2. The cruciform-perforated plate 10 is formed in the shape of a plate, not the shape of nozzle, to reduce its manufacturing costs. In place of the nozzle device 1 mounted in the reflow soldering apparatus 100 illustrated in FIG. 1, the cruciform-perforated plate 10 is attached by means of the fitting holes 14.

The plate body part 11 is provided with the cruciform apertures 12, the suction port 13, and the fitting holes 14. The gas heated or cooled down by the heating units 103, 104 or the cooling units 105 illustrated in FIG. 1 is blown through the cruciform apertures 12 perforated on the plate body part 11 in a staggered shape. The switching phenomenon occurs in the gas blown through the cruciform aperture 12, and a heat quantity per unit time of the gas applied to an object (or removed from the object) is thereby increased compared to a heat quantity of the gas blown through any common circular outlets.

The gas blown through the cruciform aperture 12 and having an increased heat quantity collides with, for example, the printed board transported to immediately above or below the cruciform-perforated plate 10. Then, the gas is reflected from the printed board and suctioned into the suction port 13. Therefore, the gas reflected from the printed board does not interrupt the gas blown through the cruciform aperture 12. Incidentally, the suction port 13 is provided with a net so that any particles or the like do not enter any preheating units 33.

Thus, when the cruciform-perforated plate 10 in accordance with the forth embodiment is mounted in the reflow soldering apparatus 100 in place of the nozzle devices 1 and 1A, the switching phenomenon is generated in the gas blown through the cruciform apertures 12, and the heat quantity per unit time of the gas applied to an object (or removed from the object) may be thereby increased.

Thus, when the gas heated or cooled down by the heating units 103, 104 or the cooling units 105 illustrated in FIG. 1 is sent to the cruciform apertures 12 by, for example, a fan, the output of a fan motor for rotating this fan can be reduced. As a result thereof, it is reduce any power consumption compared to that of a conventional reflow soldering apparatuses, thereby improving the life of the fan and the fan motor. Also, a manufacturing cost can be reduced compared to that of the blowing nozzles 2 and 2B described in the first through third embodiments.

Embodiment 5

This embodiment will describe a flow soldering apparatus 30 equipped with the nozzle device 1 described in the fourth embodiment. All of structural components called likewise and illustrated with the same reference symbols as those described in the first through fourth embodiments are functionally equal, and, therefore, will be omitted.

<Structural Example of Flow Soldering Apparatus 30>

Figure 17:
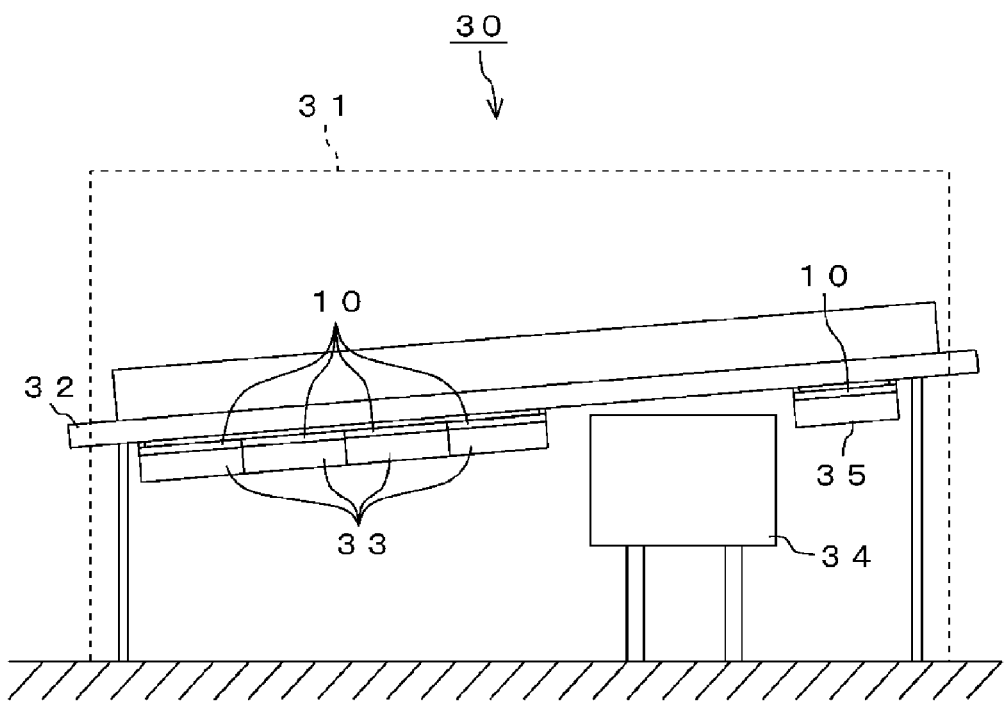
FIG. 17 is a front view of a flow soldering apparatus 30 in accordance with a fifth embodiment of the present invention showing a structural example thereof.

First, a structural example of the flow soldering apparatus 30 will be described. FIG. 17 is a front view of a flow soldering apparatus 30 in accordance with a fifth embodiment of the present invention showing a structural example thereof. As illustrated in FIG. 17, the flow soldering apparatus 30 is composed of a body case 31, a transport unit 32, preheating units 33, a jet solder bath 34 and a cooling unit 35.

The body case 31 covers the transport unit 32, the preheating units 33, the jet solder bath 34, and the cooling unit 35 to protect a printed board, not illustrated in the drawing, from being contaminated with any particles such as dust invading from outside.

The transport unit 32 transports the printed board. The transport unit 32 transports the printed board to the preheating units 33, the jet solder bath 34 and the cooling unit in the mentioned order, and then transports the printed board out of the flow soldering apparatus 30.

Figure 18:
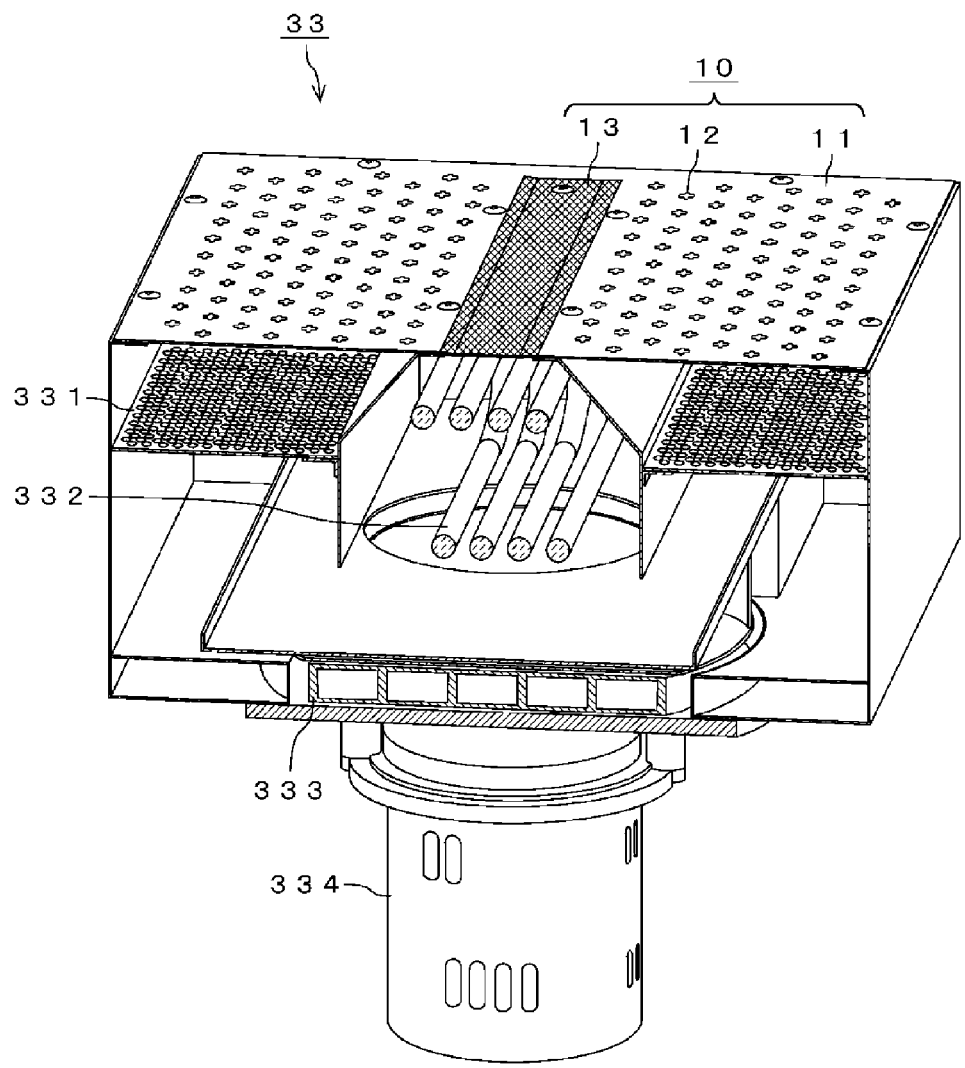
FIG. 18 is a sectional perspective view of a preheating unit 33 in the flow soldering apparatus 30 showing a structural example thereof.
Figure 19:
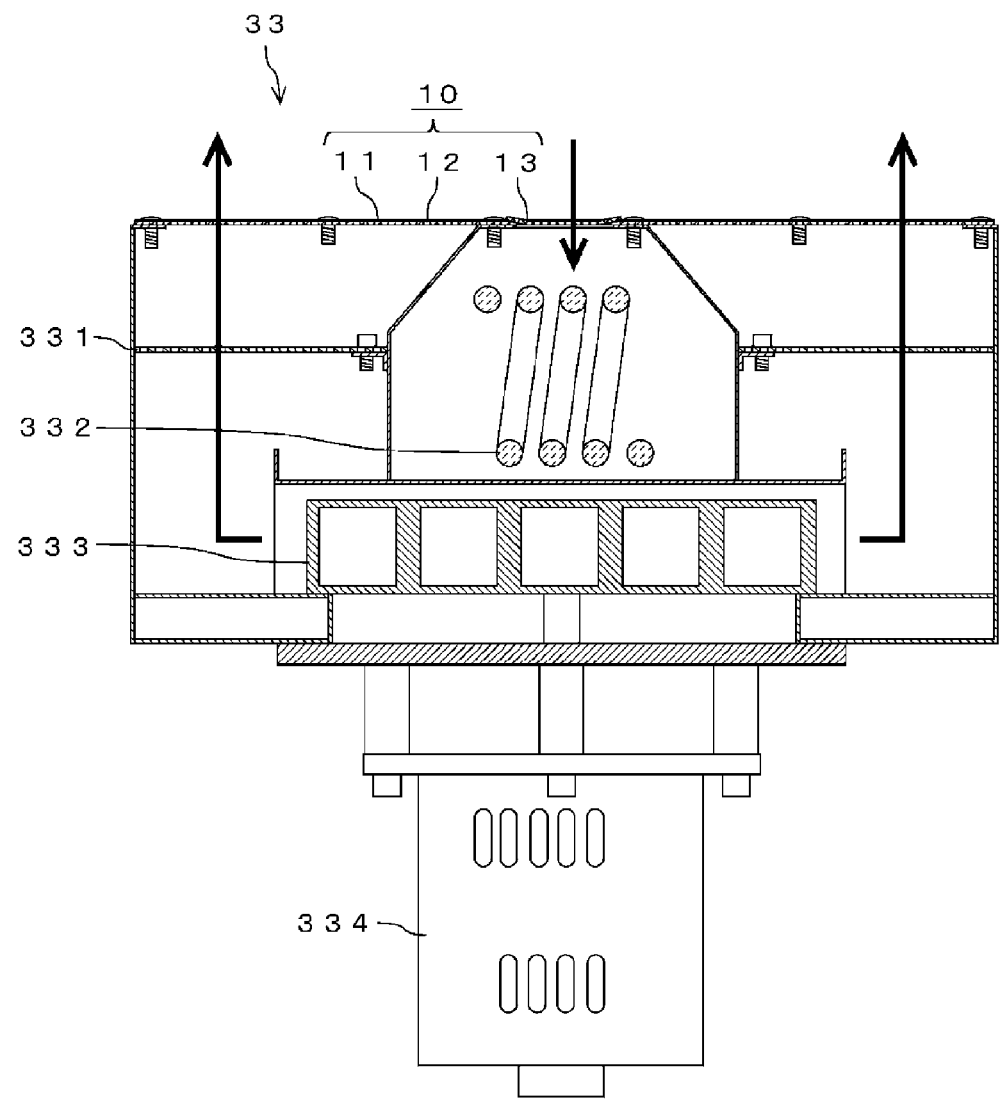
FIG. 19 is a sectional front view of the preheating unit 33 in the flow soldering apparatus 30 showing the structural example thereof.

Each of the preheating units 33 preheats the printed board to dry by hot blast the printed board coated with a fluxing agent in a fluxing step performed before the printed board has been transported to the flow soldering apparatus 30 and when performing the soldering by the jet solder bath 34, which will be described latter, to improve an adhesion strength of a solder representing a degree of adhesion of the solder on the printed board (preheating units 33 will be described in detail referring to FIGS. 18 and 19).

Each of the preheating unit 33 is provided with the cruciform-perforated plate 10 described in the forth embodiment (see FIG. 16). Each of the preheating unit 33 blows hot blast through the cruciform apertures 12 performed in the cruciform-perforated plate 10. Based on the change with time of a shape of gas in cross section perpendicular to a direction where the gas is blown through any of the cruciform apertures 12 by the projection portion (switching phenomenon), the gas heated by the preheating units 33 behaves so that a heat quantity per unit time of the gas applied to the printed board can increase compared to a heat quantity of the gas blown through any common circular outlets, thereby improving a heat exchanger effectiveness (heat transfer rate) to the printed board.

The preheating units 33 are provided with first through fourth heaters, wherein the first through fourth heaters are aligned in a direction where the printed board is transported. The first through fourth heaters are independently temperature-adjustable.

The jet solder bath 34 is provided adjacent to the preheating units 33. The jet solder bath 34 splashes any solder to the printed board dried by the preheating units 33 to form the solder in a given section of the printed board.

The cooling unit 35 is provided adjacent to the jet solder bath 34. The cooling unit 35 sends a gas flow created by a fan constituting the cooling unit 35, not illustrated, to the printed board to cool down the printed board heated by the preheating units 33 and the jet solder bath 34. By cooling down the printed board by the cooling unit 35, it is possible to prevent any cracks or the like from being generated in the solder adhered to the printed board.

Similar to the preheating units 33, the cooling unit 35 is provided with a cruciform-perforated plate 10 having cruciform apertures 12 as outlets. The cooling unit 35 blows cold blast through the cruciform apertures 12 of the cruciform-perforated plate 10. Based on the change with time of a shape of the gas in cross section perpendicular to a direction where the gas is blown through any of the cruciform apertures 12 by the projection portion, the gas heated by the cooling unit 35 behaves so that a heat quantity per unit time the gas to be removed from the printed board can increase compared to a heat quantity removed by gas blown through any common circular outlets, thereby improving a heat exchanger effectiveness (heat transfer rate) on the printed board.

<Structural Example of Each Preheating Unit 33>

Next, a structural example of each of the preheating units 33 will be described. FIG. 18 is a sectional perspective view of each of the preheating units 33 in the flow soldering apparatus 30 showing a structural example thereof. FIG. 19 is a sectional front view thereof. As illustrated in FIGS. 18 and 19, each preheating unit 33 is composed of a cruciform-perforated plate 10, rectifying plates 331, heaters 332, a fan 333, and a motor 334.

The cruciform-perforated plate 10 is provided on a top portion of each of the preheating units 33. The rectifying plates 331 and the heaters 332 are provided below the cruciform-perforated plate 10 in each of the preheating units 33. The rectifying plates 331 rectify gas flows blown through the cruciform apertures 12. The heaters 332 heat the gas suctioned through the suction port 13 provided in the cruciform-perforated plate 10.

The fan 333 is provided immediately below the heaters 332. The fan 333 is a generally called sirocco fan which suctions gas in a vertical direction and blows the suctioned gas in a lateral direction. The motor 334 is provided in the fan 333. The motor 334 is a power source, which rotates the fan 333 at a desirable number of rotations while supporting the fan 333. The number of rotations of the motor 334 and heating temperatures of the heaters 332 are controlled by a controller, not illustrated. Accordingly, the temperature of the gas blasted to the printed board transported to the preheating units 33 is controlled.

Thus, by the flow soldering apparatus 30 in accordance with the fifth embodiment, the heat exchange effectiveness (heat transfer rate) on the printed board increases with the cruciform-perforated plate 10 having the cruciform apertures 12 as the outlets, thereby reducing the output of the fan motor for rotating the fan which sends the gas heated by the preheating units 33 or the gas cooled down by the cooling unit 35 to the nozzles. As a result thereof, power consumption of the flow soldering apparatus can be reduced, and the life of the fan and the fan motor are thereby improved.

It is to be noted that although on the present embodiment, the flow soldering apparatus provided with the cruciform-perforated plate 10 has been described, the present embodiment is not limited thereto: The effect in accordance with the present embodiment can be similarly obtained in flow soldering apparatuses provided with the nozzle devices 1 and 1A described in the first and second embodiments in place of the cruciform-perforated plate 10.

The present invention is not necessarily limited to the reflow soldering apparatus and the flow soldering apparatus. The present invention is applicable to a heating apparatus by hot blast, and a cooling apparatus by cold blast.

DESCRIPTION OF REFERENCE SYMBOLS 1, 1A nozzle device
2, 2B blowing nozzle
3, 3A nozzle cover
3a hole for fitting the blowing nozzle
3b, 3c, 4c suction port
4 fitting plate
5 fixing plate
10 cruciform-perforated plate
21, 21b nozzle body part
22 cruciform aperture
23B cruciform aperture member
30 flow soldering apparatus
100 reflow soldering apparatus
101 body part
102 conveyer
103 first heating unit
104 second heating unit
105 cooling unit
200 virtual circle
201, 203, 205 projection portion
202 cruciform aperture
204 star shaped aperture
206 elliptical aperture

What is claimed is:

1. A heating device of a soldering apparatus, the heating device comprising:
   a fan that suctions gas and blows the suctioned gas;
   a heater that heats the gas;
   a blowing nozzle having a nozzle body part in which a gas flow path is defined for flow of the gas heated by the heater, and the blowing nozzle blows the gas heated by the heater through the gas flow path, which is perpendicular to a printed circuit board, and wherein the gas flow path converges from gas supply side to a gas discharge side of the nozzle body part in a gas discharging direction, and the blowing nozzle having an outlet for discharging the gas heated by the heater, the outlet defining an aperture having a non-circular planar shape that is a cross shape, a star shape or a polygonal shape, the shape including plural inwardly directed projection portions thereof each projecting inwardly from a point on a virtual circle surrounding the aperture of the outlet;
   a nozzle cover having a hole for fitting the blowing nozzle and a first suction port for suctioning a quantity of the gas reflected after hitting a printed circuit board to be heated; and
   a fitting plate that has a second suction port for recirculating the gas suctioned through the first suction port to the heater, and that fits the blowing nozzle and the nozzle cover,
   wherein the heater is provided between the fan and the second suction port of the fitting plate, the suctioned quantity of the gas reflected after hitting the printed circuit board is recirculated through the first and second suction ports, and the recirculated gas is driven to the blowing nozzle by the fan after being heated by the heater.

2. A cooling device of a soldering apparatus, the cooling device comprising:
   a fan that suctions gas and blows the suctioned gas;
   a cooling mechanism that cools down the gas;
   a blowing nozzle having a nozzle body part in which a gas flow path is defined for flow of the gas cooled down by the cooling mechanism, and the blowing nozzle blows the gas cooled by the cooling mechanism through the gas flow path, which is perpendicular to a printed circuit board, and wherein the gas flow path converges, from a gas supply side to a gas discharge side of the nozzle body part in a gas discharging direction, and the blowing nozzle having an outlet for discharging the gas cooled by the cooling mechanism, the outlet defining an aperture having a non-circular planar shape that is a cross shape, a star shape or a polygonal shape, the shape including plural inwardly directed projection portions thereof each projecting inwardly from a point on a virtual circle surrounding the aperture of the outlet;
   a nozzle cover having a hole for fitting the blowing nozzle and a first suction port for suctioning a quantity of the gas reflected after hitting a printed circuit board to be cooled; and
   a fitting plate that has a second suction port for recirculating the gas suctioned through the first suction port to the cooling mechanism, and that fits the blowing nozzle and the nozzle cover, wherein the cooling mechanism is provided between the fan and the second suction port of the fitting plate, the suctioned quantity of the gas reflected after hitting the printed circuit board is recirculated through the first and second suction ports, and the recirculated gas is driven to the blowing nozzle by the fan after being cooled by the cooling mechanism.

3. A heating device of a soldering apparatus, the heating device comprising:
   a fan that suctions gas and blows the suctioned gas;
   a heater that heats the gas; and
   a plate in which a gas flow path is defined for flow of the gas heated by the heater, and the plate directs the gas heated by the heater through the gas flow path, which is perpendicular to a printed circuit board, and wherein the gas flow path is parallel from a gas supply side to a gas discharge side of the plate in a gas discharging direction, and the plate having an outlet for blowing the gas heated by the heater and a suction port for suctioning a quantity of the gas reflected after hitting a printed circuit board to be heated, the outlet defining an aperture having a non-circular planar shape that is a cross shape, a star shape or a polygonal shape, the shape including plural inwardly directed projection portions thereof each projecting inwardly from a point on a virtual circle surrounding the aperture of the outlet,
   wherein the heater is provided between the fan and the suction port of the plate and the suctioned quantity of the gas reflected after hitting the printed circuit board is recirculated to the fan through the suction port and the recirculated gas is driven to the outlet by the fan after being heated by the heater.

4. A cooling device of a soldering apparatus, the cooling device comprising:
   a fan that suctions gas and blows the suctioned gas;
   a cooling mechanism that cools down the gas; and
   a plate in which a gas flow path is defined for flow of the gas cooled down by the cooling mechanism, and the plate directs the gas cooled by the cooling mechanism through the gas flow path, which is perpendicular to a printed circuit board, wherein the gas flow path is parallel from a gas supply side to a gas discharge side of the plate in a gas discharging direction, and the plate having an outlet for blowing the gas cooled by the cooling mechanism and a suction port for suctioning a quantity of the gas reflected after hitting a printed circuit board to be cooled, the outlet defining an aperture having a non-circular planar shape that is a cross shape, a star shape or a polygonal shape, the shape including plural inwardly directed projection portions thereof each projecting inwardly from a point on a virtual circle surrounding the aperture of the outlet, wherein the cooling mechanism is provided between the fan and the suction port of the plate and the suctioned quantity of the gas reflected after hitting the printed circuit board is recirculated through the suction port and the recirculated gas is driven to the outlet by the fan after being cooled by the cooling mechanism.

5. A heating device of a soldering apparatus, the heating device comprising:

a fan that suctions gas and blows the suctioned gas;

a heater that heats the gas;

a blowing nozzle having a nozzle body part in which a gas flow path is defined for flow of the gas heated by the heater and the blowing nozzle blows the gas heated by the heater through the gas flow path, which is perpendicular to a printed circuit board, and wherein the gas flow path is parallel, from a gas supply side to a gas discharge side of the nozzle body part in a gas discharging direction, and the blowing nozzle having an outlet for discharging the gas heated by the heater, the outlet defining an aperture having a non-circular planar shape that is a cross shape, a star shape or a polygonal shape, the shape including plural inwardly directed projection portions thereof each projecting inwardly from a point on a virtual circle surrounding the aperture of the outlet;

a nozzle cover having a hole for fitting the blowing nozzle and a first suction port for suctioning a quantity of the gas reflected after hitting a printed circuit board to be heated; and a fitting plate that has a second suction port for recirculating the gas suctioned through the first suction port to the heater, and that fits the blowing nozzle and the nozzle cover, wherein the heater is provided between the fan and the second suction port of the fitting plate, the suctioned quantity of the gas reflected after hitting the printed circuit board is recirculated through the first and second suction ports, and the recirculated gas is driven to the blowing nozzle by the fan after being heated by the heater.

6. A cooling device of a soldering apparatus, the cooling device comprising:

a fan that suctions gas and blows the suctioned gas;

a cooling mechanism that cools down the gas;

a blowing nozzle having a nozzle body part, in which a gas flow path is defined for flow of the gas cooled down by the cooling mechanism, and the blowing nozzle blows the gas cooled by the cooling mechanism through the gas flow path, which is perpendicular to a printed circuit board, and wherein the gas flow path is parallel, from a gas supply side to a gas discharge side of the nozzle body part in a gas discharging direction, and the nozzle body part having an outlet for discharging the gas cooled by the cooling mechanism, the outlet defining an aperture having a non-circular planar shape that is a cross shape, a star shape or a polygonal shape, the shape including plural inwardly directed projection portions thereof each projecting inwardly from a point on a virtual circle surrounding the aperture of the outlet;

a nozzle cover having a hole for fitting the blowing nozzle and a first suction port for suctioning a quantity of the gas reflected after hitting a printed circuit board to be cooled; and a fitting plate that has a second suction port for recirculating the gas suctioned through the first suction port to the cooling mechanism, and that fits the blowing nozzle and the nozzle cover, wherein the cooling mechanism is provided between the fan and the second suction port of the fitting plate, the suctioned quantity of the gas reflected after hitting the printed circuit board is recirculated through the first and second suction ports, and the recirculated gas is driven to the blowing nozzle by the fan after being cooled by the cooling mechanism.

* * * * *